(12) United States Patent
Zhang et al.

(10) Patent No.: US 8,193,848 B2
(45) Date of Patent: Jun. 5, 2012

(54) POWER SWITCHING DEVICES HAVING CONTROLLABLE SURGE CURRENT CAPABILITIES

(75) Inventors: Qingchun Zhang, Cary, NC (US); James Theodore Richmond, Hillsborough, NC (US); Anant K. Agarwal, Chapel Hill, NC (US); Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/610,582

(22) Filed: Nov. 2, 2009

(65) Prior Publication Data
US 2010/0301929 A1   Dec. 2, 2010

Related U.S. Application Data

(60) Provisional application No. 61/183,214, filed on Jun. 2, 2009.

(51) Int. Cl.
*H03K 5/08* (2006.01)
(52) U.S. Cl. ............ 327/318; 327/319; 327/483; 361/56
(58) Field of Classification Search .................. 327/318, 327/483, 319; 361/56
See application file for complete search history.

(56) References Cited

U.S. PATENT DOCUMENTS

| | | | |
|---|---|---|---|
| 3,439,189 A | 4/1969 | Petry | |
| 3,629,011 A | 12/1971 | Tohi et al. | |
| 3,924,024 A | 12/1975 | Naber et al. | |
| 4,160,920 A | 7/1979 | Courier de Mere | |
| 4,242,690 A | 12/1980 | Temple | |
| 4,466,172 A | 8/1984 | Batra | |
| 4,581,542 A | 4/1986 | Steigerwald | |
| 4,644,637 A | 2/1987 | Temple | |
| 4,811,065 A | 3/1989 | Cogan | |
| 4,875,083 A | 10/1989 | Palmour | |

(Continued)

FOREIGN PATENT DOCUMENTS
DE      39 42 640 A1    8/1990
(Continued)

OTHER PUBLICATIONS

Notification of Transmittal of the International Search Report and the Written Opinion of the International Searching Authority, or the Declaration, International Search Report, Written Opinion of the International Searching Authority, PCT/US2010/035713, Date of Mailing Jul. 27, 2010, 14 pages.

(Continued)

*Primary Examiner* — Kenneth B. Wells
(74) *Attorney, Agent, or Firm* — Myers Bigel Sibley & Sajovec

(57) ABSTRACT

Semiconductor switching devices include a wide band-gap power transistor, a wide band-gap surge current transistor that coupled in parallel to the power transistor, and a wide band-gap driver transistor that is configured to drive the surge current transistor. Substantially all of the on-state output current of the semiconductor switching device flows through the channel of the power transistor when a drain-source voltage of the power transistor is within a first voltage range, which range may correspond, for example, to the drain-source voltages expected during normal operation. In contrast, the semiconductor switching device is further configured so that in the on-state the output current flows through both the surge current transistor and the channel of the power transistor when the drain-source voltage of the power transistor is within a second, higher voltage range.

30 Claims, 4 Drawing Sheets

U.S. PATENT DOCUMENTS

| | | |
|---|---|---|
| 4,927,772 A | 5/1990 | Arthur et al. |
| 4,945,394 A | 7/1990 | Palmour et al. |
| 4,946,547 A | 8/1990 | Palmour et al. |
| 5,011,549 A | 4/1991 | Kong et al. |
| 5,028,977 A * | 7/1991 | Kenneth et al. ............... 257/370 |
| 5,032,888 A | 7/1991 | Seki |
| 5,111,253 A | 5/1992 | Korman et al. |
| 5,155,289 A | 10/1992 | Bowles |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,270,554 A | 12/1993 | Palmour |
| 5,292,501 A | 3/1994 | Degenhardt et al. |
| 5,296,395 A | 3/1994 | Khan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,399,887 A | 3/1995 | Weitzel et al. |
| 5,459,107 A | 10/1995 | Palmour |
| 5,468,654 A | 11/1995 | Harada |
| 5,473,176 A | 12/1995 | Kakumoto |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,629,531 A | 5/1997 | Palmour |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,763,905 A | 6/1998 | Harris |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh |
| 5,972,801 A | 10/1999 | Lipkin et al. |
| 5,976,936 A | 11/1999 | Miyajima et al. |
| 5,977,605 A | 11/1999 | Bakowsky et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,352 A | 4/2000 | Ueno |
| 6,054,728 A | 4/2000 | Harada et al. |
| 6,063,698 A | 5/2000 | Tseng et al. |
| 6,083,814 A | 7/2000 | Nilsson |
| 6,096,607 A | 8/2000 | Ueno |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,254 B1 | 4/2001 | Singh et al. |
| 6,218,680 B1 | 4/2001 | Carter, Jr. et al. |
| 6,221,688 B1 | 4/2001 | Fujihira et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,246,076 B1 | 6/2001 | Lipkin et al. |
| 6,297,100 B1 | 10/2001 | Kumar et al. |
| 6,297,172 B1 | 10/2001 | Kashiwagi |
| 6,303,508 B1 | 10/2001 | Alok |
| 6,316,791 B1 | 11/2001 | Schorner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,515,303 B2 | 2/2003 | Ring |
| 6,524,900 B2 | 2/2003 | Dahlqvist et al. |
| 6,548,333 B2 | 4/2003 | Smith |
| 6,551,865 B2 | 4/2003 | Kumar et al. |
| 6,573,534 B1 | 6/2003 | Kumar et al. |
| 6,593,620 B1 | 7/2003 | Hshieh et al. |
| 6,610,366 B2 | 8/2003 | Lipkin |
| 6,627,539 B1 | 9/2003 | Zhao et al. |
| 6,649,497 B2 | 11/2003 | Ring |
| 6,653,659 B2 | 11/2003 | Ryu et al. |
| 6,696,705 B1 | 2/2004 | Barthelmess et al. |
| 6,703,642 B1 | 3/2004 | Shah |
| 6,743,703 B2 | 6/2004 | Rodov et al. |
| 6,767,843 B2 | 7/2004 | Lipkin et al. |
| 6,861,723 B2 | 3/2005 | Willmeroth |
| 6,936,850 B2 | 8/2005 | Friedrichs et al. |
| 6,946,739 B2 | 9/2005 | Ring |
| 6,956,238 B2 | 10/2005 | Ryu et al. |
| 6,979,863 B2 | 12/2005 | Ryu |
| 7,026,650 B2 | 4/2006 | Ryu et al. |
| 7,074,643 B2 | 7/2006 | Ryu |
| 7,118,970 B2 | 10/2006 | Das et al. |
| 7,125,786 B2 | 10/2006 | Ring et al. |
| 7,183,575 B2 | 2/2007 | Shimoida et al. |
| 7,221,010 B2 | 5/2007 | Ryu |
| 7,247,550 B2 | 7/2007 | Zhang |
| 7,253,031 B2 | 8/2007 | Takahashi |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,528,040 B2 | 5/2009 | Das et al. |
| 7,544,963 B2 | 6/2009 | Saxler |
| 7,548,112 B2 | 6/2009 | Sheppard |
| 7,649,213 B2 | 1/2010 | Hatakeyama et al. |
| 7,687,825 B2 | 3/2010 | Zhang |
| 7,728,402 B2 | 6/2010 | Zhang et al. |
| 2001/0055852 A1 | 12/2001 | Moise et al. |
| 2002/0030191 A1 | 3/2002 | Das et al. |
| 2002/0038891 A1 | 4/2002 | Ryu et al. |
| 2002/0047125 A1 | 4/2002 | Fukuda et al. |
| 2002/0072247 A1 | 6/2002 | Lipkin et al. |
| 2002/0102358 A1 | 8/2002 | Das et al. |
| 2002/0121641 A1 | 9/2002 | Alok et al. |
| 2002/0125482 A1 | 9/2002 | Friedrichs et al. |
| 2002/0125541 A1 | 9/2002 | Korec et al. |

| | | | |
|---|---|---|---|
| 2003/0025175 A1 | 2/2003 | Asano et al. | |
| 2003/0107041 A1 | 6/2003 | Tanimoto et al. | |
| 2003/0137010 A1 | 7/2003 | Friedrichs et al. | |
| 2003/0178672 A1 | 9/2003 | Hatakeyama et al. | |
| 2003/0201455 A1 | 10/2003 | Takahashi et al. | |
| 2004/0016929 A1 | 1/2004 | Nakatsuka et al. | |
| 2004/0082116 A1 | 4/2004 | Kub et al. | |
| 2004/0183079 A1 | 9/2004 | Kaneko et al. | |
| 2004/0211980 A1 | 10/2004 | Ryu | |
| 2004/0212011 A1 | 10/2004 | Ryu | |
| 2004/0256659 A1 | 12/2004 | Kim et al. | |
| 2004/0259339 A1 | 12/2004 | Tanabe et al. | |
| 2005/0012143 A1 | 1/2005 | Tanaka et al. | |
| 2005/0104072 A1 | 5/2005 | Slater, Jr. et al. | |
| 2005/0139936 A1 | 6/2005 | Li | |
| 2005/0151138 A1 | 7/2005 | Slater, Jr. et al. | |
| 2005/0181536 A1 | 8/2005 | Tsuji | |
| 2005/0224838 A1 | 10/2005 | Tanaka et al. | |
| 2005/0245034 A1 | 11/2005 | Fukuda et al. | |
| 2005/0275055 A1 | 12/2005 | Parthasarathy et al. | |
| 2006/0011128 A1 | 1/2006 | Ellison et al. | |
| 2006/0060884 A1 | 3/2006 | Ohyanagi et al. | |
| 2006/0086997 A1 | 4/2006 | Kanaya et al. | |
| 2006/0211210 A1 | 9/2006 | Bhat et al. | |
| 2006/0244010 A1 | 11/2006 | Saxler | |
| 2006/0255423 A1 | 11/2006 | Ryu et al. | |
| 2006/0261347 A1 | 11/2006 | Ryu et al. | |
| 2006/0261876 A1 | 11/2006 | Agarwal et al. | |
| 2006/0267021 A1 | 11/2006 | Rowland et al. | |
| 2007/0066039 A1 | 3/2007 | Agarwal et al. | |
| 2007/0120148 A1 | 5/2007 | Nogome | |
| 2007/0164321 A1 | 7/2007 | Sheppard | |
| 2007/0241427 A1 | 10/2007 | Mochizuki et al. | |
| 2008/0001158 A1 | 1/2008 | Das et al. | |
| 2008/0006848 A1 | 1/2008 | Chen et al. | |
| 2008/0029838 A1 | 2/2008 | Zhang et al. | |
| 2008/0105949 A1 | 5/2008 | Zhang et al. | |
| 2008/0121993 A1 | 5/2008 | Hefner et al. | |
| 2008/0191304 A1 | 8/2008 | Zhang et al. | |
| 2008/0230787 A1 | 9/2008 | Suzuki et al. | |
| 2008/0251793 A1 | 10/2008 | Mazzola | |
| 2008/0277669 A1 | 11/2008 | Okuno et al. | |
| 2008/0296587 A1 | 12/2008 | Yamamoto et al. | |
| 2008/0296771 A1 | 12/2008 | Das et al. | |
| 2009/0085064 A1 | 4/2009 | Rueb et al. | |
| 2009/0121319 A1 | 5/2009 | Zhang et al. | |
| 2009/0146154 A1 | 6/2009 | Zhang et al. | |
| 2009/0212301 A1 | 8/2009 | Zhang et al. | |
| 2009/0267200 A1 | 10/2009 | Gutt et al. | |
| 2009/0272983 A1 | 11/2009 | Kumar et al. | |
| 2009/0289262 A1 | 11/2009 | Zhang et al. | |
| 2010/0032685 A1 | 2/2010 | Zhang et al. | |
| 2010/0133549 A1 | 6/2010 | Zhang et al. | |
| 2010/0133550 A1 | 6/2010 | Zhang et al. | |
| 2010/0140628 A1 | 6/2010 | Zhang | |
| 2010/0244047 A1 | 9/2010 | Hull et al. | |

FOREIGN PATENT DOCUMENTS

| | | | |
|---|---|---|---|
| DE | 198 09 554 | | 9/1998 |
| DE | 198 32 329 | A1 | 2/1999 |
| DE | 19900171 | | 7/1999 |
| DE | 10036208 | A1 | 2/2002 |
| EP | 0 176 778 | A2 | 4/1986 |
| EP | 0 372 412 | A1 | 6/1990 |
| EP | 0 389 863 | A1 | 10/1990 |
| EP | 0 615 292 | A1 | 9/1994 |
| EP | 0637069 | A1 | 2/1995 |
| EP | 0735591 | A1 | 10/1996 |
| EP | 0837508 | A2 | 4/1998 |
| EP | 0 865 085 | A1 | 9/1998 |
| EP | 1 058 317 | A2 | 12/2000 |
| EP | 1 361 614 | A1 | 11/2003 |
| EP | 1 460 681 | A2 | 9/2004 |
| EP | 1 503 425 | A2 | 2/2005 |
| EP | 1 693896 | A1 | 8/2006 |
| EP | 1 806 787 | A1 | 7/2007 |
| EP | 1 845 561 | A2 | 10/2007 |
| EP | 2 015 364 | | 1/2009 |
| JP | 60-240158 | | 11/1985 |
| JP | 01117363 | | 5/1989 |
| JP | 03034466 | | 2/1991 |
| JP | 03157974 | | 7/1991 |
| JP | 3-225870 | | 10/1991 |
| JP | 08264766 | | 10/1996 |
| JP | 09205202 | | 8/1997 |
| JP | 11191559 | | 7/1999 |
| JP | 11238742 | A | 8/1999 |
| JP | 11261061 | A | 9/1999 |
| JP | 11266017 | A | 9/1999 |
| JP | 11274487 | | 10/1999 |
| JP | 2000049167 | | 2/2000 |
| JP | 2000082812 | A | 3/2000 |
| JP | 2000-252478 | A | 9/2000 |
| JP | 02000252461 | A | 9/2000 |
| JP | 2001-085704 | | 3/2001 |
| JP | 2000106371 | A | 4/2001 |
| JP | 2002-314099 | | 10/2002 |
| WO | WO 96/03774 | | 2/1996 |
| WO | WO 97/08754 | | 3/1997 |
| WO | WO 97/17730 | | 5/1997 |
| WO | WO 97/39485 | A1 | 10/1997 |
| WO | WO 98/02916 | | 1/1998 |
| WO | WO 98/02924 | A2 | 1/1998 |
| WO | WO 98/08259 | | 2/1998 |
| WO | WO 98/32178 | | 7/1998 |
| WO | WO 99/46809 | A1 | 9/1999 |
| WO | WO 99/63591 | A1 | 12/1999 |
| WO | WO 00/13236 | A3 | 3/2000 |
| WO | WO 01/78134 | A1 | 10/2001 |
| WO | WO 2004/020706 | A1 | 3/2004 |
| WO | WO 2004/079789 | A2 | 9/2004 |
| WO | WO 2005/020308 | A1 | 3/2005 |
| WO | WO 2006/135031 | A2 | 12/2006 |
| WO | WO 2007/040710 | A1 | 4/2007 |

OTHER PUBLICATIONS

J. T. Richmond, S. Ryu, A.K. Agarwal and J.W. Palmour, "Hybrid 4H-SiC MOS Gated Transistor (MGT)" (admitted prior art).

"Insulated-gate bipolar transistor." *Wikipedia, the Free Encyclopedia*. Web. Jun. 21, 2010. http://en.wikipedia.org.

A.K. Agarwal, J.B. Casady, L.B. Rowland, W.F. Valek, and C.D. Brandt, "1400 V 4H-SiC Power MOSFET's," Materials Science Forum vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.

A.K. Agarwal, S. Seshadri, and L.B. Rowland, "Temperature Dependence of Fowler-Nordheim Current in 6H- and 4H-SiC MOS Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.

Ayalew, T, "Dissertation of Tesfaye Ayalew", Section 4.4.3.1 MPS Diode Structure, *SiC Semiconductor Devices Technology, Modeling, and Simulation*, 2006.

Baliga "Insulated Gate Biopolar Transistor" *Power Semiconductor Devices*. PWS Publishing Company, Boston, MA. 426-502 (1996).

Baliga "Power MOSFET" *Power Semiconductor Devices*. PWS Publishing Company, Boston, MA 335-425 (1996).

Baliga, Power Semiconductor Devices, Chapter 7, PWS Publishing, 1996.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Buchner et al., "Laser Recrystallization of Polysilicon for Improved Device Quality", Springer Proceedings in Physics, vol. 35, Polycrystalline Semiconductors, pp. 289-294.

Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).

Chakraborty et al. "Interface Properties of $N_2O$-annealed $SiO_2SiC$ system," *Proceedings IEEE Hong Kong Electron Devices Meeting.* Jun. 24, 2000, pp. 108-111.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.

Chen et al. "Theoretical Analysis of Current Crowding Effect in Metal/AlGaN/GaN Schottky Diodes and Its Reduction by Using Polysilicon in Anode,"Chin. Phys. Lett., vol. 24, No. 7 (2007) pp. 2112-2114.

Chinese Office Action dated Jan. 22, 2010, corresponding to Chinese Patent Application No. 200780029460.5, 7 pages.

Cho et al. "Improvement of charge trapping by hydrogen post-oxidation annealing in gate oxide of 4H-SiC methel-oxide-semiconductor capacitors," *Applied Physics Letters*. vol. 77, No. 8, pp. 1215-1217 (Aug. 21, 2000).

Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.

Chung et al., "The Effect of Si:C Source Ratio on $SiO_2$/SiC Interface State Density for Nitrogen Doped 4H and 6H-SiC," *Materials Science Forum.* (2000) vols. 338-342, pp. 1097-1100.

International Search Report and Written Opinion for corresponding International Application No. PCT/US2004/004982, dated Jul. 22, 2004.

International Search Report for PCT/US01/30715.

International Search Report for PCT/US01/42414, dated Apr. 23, 2002.

International Search Report for PCT/US02/11691 dated Dec. 4, 2002.

D. Alok, E. Arnold, and R. Egloff, "Process Dependence of Inversion Layer Mobility in 4H-SiC Devices," *Materials Science Forum*, vols. 338-342, pp. 1077-1080, 2000.

Dahlquist et al. "A 2.8kV, Forward Drop JBS Diode with Low Leakage," *Materials Science Forum*, vols. 338-342, (2000) pp. 1179-1182.

Das, Mrinal K. Graduate thesis entitled, *Fundamental Studies of the Silicon Carbide MOS Structure*. Purdue University, 1999.

Dastidar, Sujoyita, A Study of P-Type Activation in Silicon Carbide, Thesis (Purdue University, May 1998).

De Meo et al., "Thermal Oxidation of SiC in $N_2O$", *J. Electrochem. Soc.*, vol. 141, 1994, pp. L150-L152.

del Prado et al. "Full Composition Range Silicon Oxynitride Films Deposited by ECR-PECVD at Room Temperatures," *Thin Solid Films.* vol. 343-344 (1999) p. 437-440.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

European Search Report for corresponding EP patent application No. 09177558.5 dated Feb. 22, 2010.

European Search Report for corresponding EP patent application No. 09163424.6 dated Apr. 9, 2010.

European Search Report; Application No. EP07120038; Jun. 16, 2008.

Extended European Search Report (12 pages) corresponding to European Application No. 07112298; Dated Feb. 18, 2009.

Fisher, C.A. et al., "The performance of high-voltage field relieved Schottky barrier diodes", IEE Proceedings, vol. 132:6, Pt. I, pp. 257-260 (Dec. 1985).

Fukuda et al. "Improvement of $SiO_2$/4H-SiC Interface Using High-Temperature Hydrogen Annealing at Low Pressure and Vacuum Annealing," *Jpn J. Appl. Phys.* vol. 38, Apr. 1999, pp. 2306-2309.

Fukuda et al. "Improvement of $SiO_2$/4H-SiC Interface by Using High Temperature Hydrogen Annealing at 1000° C," *Extended Abstracts of the International Conference on Solid State Devices and Materials.* Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.

H.F. Li, S. Dimitrijev, H.B. Harrison, D. Sweatman, P.T. Tanner. "Improving $SiO_2$ Grown on P-Type 4H-SiC by NO Annealing," *Materials Science Forum*. vols. 264-268 (1998) pp. 869-872.

http://www.elec.gla.ac.uk; *The Insulated Gate Bipolar Transistor (IGBT)*; Feb. 14, 2007.

Hubel, K, "Hybrid design improves diode robustness and boosts efficiency," Compoundsemiconductor.net, 2006.

Hull et al., "Drift-Free 10-kV, 20-A 4H-SiC PiN Diodes," Journal of Electronic Materials, vol. 34, No. 4, 2005, pp. 341-344.

International Preliminary Report on Patentability (9 pages) corresponding to International Application No. PCT/US2007/010192; Mailing Date: Sep. 23, 2008.

International Search Report and Written Opinion (13 pages) corresponding to International Application No. PCT/US2008/010538; Mailing Date: Dec. 22, 2008.

International Search Report and Written Opinion (14 pages) corresponding to International Application No. PCT/US2010/020071; Mailing Date: Mar. 26, 2010.

International Search Report and Written Opinion (14 pages) corresponding to International Application No. PCT/US2009/065251; Mailing Date: Jun. 1, 2010.

International Search Report and Written Opinion (16 pages) corresponding to International Application No. PCT/US2009/003089; Mailing Date: Aug. 20, 2009.

International Search Report and Written Opinion for PCT/US2007/014139; Feb. 4, 2008.

International Search Report and Written Opinion for PCT/US2010/025053 mailed on Jul. 2, 2010.

International Search Report and Written Opinion, International Application No. PCT/US2009/000734, Apr. 23, 2009.

International Search Report, PCT/US2008/008574, Sep. 26, 2008.

Invitation to Pay Additional Fees for PCT/US2007/010192; Oct. 29, 2007.

Invitation to Pay Additional Fees for PCT/US2010/025053 mailed on May 3, 2010.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

J.T. Richmond, S. Ryu, A.K. Agarwal and J.W. Palmour, "Hybrid 4H-SiC MOS Gated Transistor (MGT)" (admitted prior art).

Jamet, et al. "Physical properties of $N_2O$ and NO-nitrided gate oxides grown on 4H SiC," *Applied Physics Letters*. vol. 79, No. 3, Jul. 16, 2001, pp. 323-325.

K. Ueno and Tadaaki Oikawa, "Counter-Doped MOSFET's of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

Katsunori Ueno, Tatsue Urushidani, Kouicki Hahimoto, and Yasukazu Seki. "The Guard-Ring Termination for the High-Voltage SiC Schottky Barrier Diodes". *IEEE Electron Device Letters*. vol. 16. No. 7, Jul. 1995, pp. 331-332.

Kinoshita et al., "Guard Ring Assisted RESURF: A New Termination Structure Providing Stable and High Breakdown Voltage for SiC Power Devices,"Tech. Digest of ISPSD '02, pp. 253-256.

Kobayashi et al. "Dielectric Breakdown and Current Conduction of Oxide/Nitride/Oxide Multi-Layer Structures," *1990 IEEE Symposium on VLSI Technology*. pp. 119-120.

Krishnaswami et al., "High Temperature characterization of 4H-SiC bipolar junction transistors", Materials Science Forum, Aedermannsfdorf, CH, vol. 527-529, Jan. 1, 2006, pp. 1437-1440, XP009138720, ISSN: 0255-5476.

L.A. Lipkin and J.W. Palmour, "Low interface state density oxides on p-type SiC," Materials Science Forum vols. 264-268, pp. 853-856, 1998.

Lai et al., "Interface Properties of $N_2O$-Annealed $NH_3$-Treated 6H-SiC MOS Capacitor," *Proc. 1999 IEEE Hong Kong Electron Devices Meeting*, Jun. 26, 1999, pp. 46-49.

Leonhard et al. "Long term stability of gate-oxides on n- and p-type silicon carbide studied by charge injection techniques," *Materials Science Engineering*, vol. 46, No. 1-3, Apr. 1997, pp. 263-266.

Levinshtein et al., "On the homogeneity of the turn-on process in high voltage 4H-SiC thyristors", *Solid-State Electronics*, vol. 49, No. 2, Feb. 1, 2005, pp. 233-237, XP004645018 Elsevier Science Publishers, Barking (GB) ISSN: 0038-1101.

Lipkin et al. "Insulator Investigation on SiC for Improved Reliability," *IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, 2001, pp. 27-29.

Losee et al., "Degraded Blocking Performance of 4H-SiC Rectifiers Under High dV/dt Conditions", Proceedings of $17^{th}$ International Symposium on Power Semiconductor Devices & IC's, 4 pages (May 23-26, 2005). XP010820730.

Losee et al., "High-Voltage 4H-SiC PiN Rectifiers with Single-Implant, Multi-Zone JTE Termination", Power Semiconductor Devices and ICs, 2004 Proceedings. ISPSB '04. The $16^{th}$ International Symposium on Kitakyushu Int. Conf. Center, Japan May 24-27, 2004, Piscataway, NJ, USA, IEEE, May 24, 2004, pp. 301-304, XP010723398.

M. Das et al., "A 13 kV 4H-SiC N-Channel IGBT with Low Rdiff, on and Fast Switching" presented at: International Conference on Silicon Carbide and Related Materials )ICSCRM), Otsu, Japan, Oct. 14-19, 2007.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.

Myer-Ward et al. "Turning of Basal Plane Dislocations During Epitaxial Growth on 4 off-axis 4h-SiC" $7^{th}$ *European Conference on Silicon Carbide and Related Materials*, Barcelona-Spain, Sep. 7-11, 2008 retrieved from http://ecscrm08.com/invited_presentations.html , retrieved Jul. 1, 2009.

Notification of Transmittal of the International Search Report and the Written Opinion of the International Searching Authority, or the Declaration, International Search Report, Written Opinion of the International Searching Authority, PCT/US2010/026632, Date of Mailing: Oct. 8, 2010, 16 pages.

Notification of Transmittal of the International Search Report and the Written Opinion of the International Searching Authority, or the Declaration, International Search Report, Written Opinion of the International Searching Authority, PCT/US2010/035713, Date of Mailing: Jul. 27, 2010, 14 pages.

Notification of Transmittal of the International Search Report and the Written Opinion of the International Searching Authority, or the Declaration, International Search Report, Written Opinion of the International Searching Authority, PCT/US2010/042075, Date of Mailing: Sep. 24, 2010, 15 pages.

Notification of Transmittal of the International Search Report and the Written Opinion of the International Searching Authority, or the Declaration, PCT/US2010/028612, Jun. 17, 2010.

Notification of Transmittal of the International Search Report and the Written Opinion of the International Searching Authority, or the Declaration; International Search Report; Written Opinion of the International Searching Authority, PCT/US2008/004239, Mar. 2, 2009.

P.J. Tobin, Y. Okada, S. A. Ajuria, V. Lakhotia, W.A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters*, vol. 76, No. 25, pp. 3744-3746, Jun. 2000.

Palmour et al. "SiC Device Technology: Remaining Issues," Diamond and Related Materials. vol. 6, 1997, pp. 1400-1404.

Palmour J: "Silicon Carbide npnp Thyristors", NASA Technical Briefs—Electronics and Computers, Dec. 1, 2000, John H. Glenn Research Center, Cleveland, Ohio (US); XP-002567723, http://www.techbriefs.com/component/content/article/7031-lew-16750?tmpl=component&print=1&page= retrieved on Feb. 10, 2010).

Panknin et al., "Electrical and microstructural properties of highly boron-implantation doped 6H-SiC", Journal of Applied Physics 89:6, pp. 3162-3167 (Mar. 15, 2001).

Pantelides et al., "Atomic-Scale Engineering of the SiC-SiO2 Interface," *Materials Science Forum*. (2000) vols. 338-342, pp. 1133-1136.

Patel, R., et al., Phosphorus-Implanted High-Voltage N.sup.+ P 4H-SiC Junction Rectifiers, Proceedings of 1998 International Symposium on Poer Semiconductor Devices & ICs, pp. 387-390 (Kyoto).

Q. Zhang et al. "12 kV 4H-SiC p-IGBTs with Record Low Specific On-Resistance" presented at: International Conference on Silicon Carbide and Related Materials (ICSCRM), Otsu, Japan, Oct. 14-19, 2007.

R. Schörner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Rao et al. "Al and N Ion Implantations in 6H-SiC," Silicon Carbide and Related Materials. 1995 Conf, Kyoto, Japan. Published 1996.

Rao et al. "P-N Junction Formation in 6H-SiC by Acceptor Implantation into N-Type Substrate," Nuclear Instruments and Methods in Physics Research B. vol. 106, 1995, pp. 333-338.

Rao et al. "Silane overpressure post-implant annealing of Al dopants in SiC: Cold wall CVD apparatus" *Applied Surface Science* 252: 3837-3842 (2006).

Rao, "Maturing ion-implantation technology and its device applications in SiC", *Solid State Electronics* 47:2, pp. 213-222, Elsevier Science Publishers (Feb. 2003).

Ryu et al. Article and Presentation: "27 mΩ-cm$^2$, 1.6 kV Power DiMOSFETs in 4H-SiC," *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

S.M. Sze SeMiconductor Devices, Physics and Technology. 2$^{nd}$ Edition, © 2002 John Wiley and Sons, p. 130.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Senzaki et al.; *Effects of Pyrogenic Reoxidation Annealing on Inversion Channel Mobility of 4H-SiC Metal-Oxide-Semiconductor Field-Effect Transistor Fabricated on (1120) Face*; Japanese Journal of Applied Physics, Japan Society of Applied Physics, Tokyo, JP; vol. 40, No. 11B, Part 2; Nov. 2001; pp. L1201-L1203.

Singh, R. and J.W. Palmour, "Planer Terminations in 4H-SiC Schottky Diodes with Low Leakage and High Yields,"IEEE International Symposium on Power Semiconductor Devices and ICs, 1997, pp. 157-160.

Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.

Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.

Streetman "Bipolar Junction Transistors" *Solid State Electronic Devices*. Prentice Hall, Englewood Cliffs, NJ. 228-284 (1980).

Sugawara et al., "3.6 kV 4H-SiC JBS Diodes with Low RonS". Materials Science Forum, vols. 338-342:2, pp. 1183-1186 (2000). XP-000944901.

Sundaresan et al., "Ultra-low resistivity Al+ implanted 4H-SiC obtained by microwave annealing and a protective graphite cap", *Solid-State Electronics* vol. 52, 2008, pp. 140-145, XP022360431.

Suzuki et al. "Effect of Post-oxidation-annealing in Hydrogen on SiO$_2$/4H-SiC Interface," *Materials Science Forum*, vols. 338-342 (2000) 1073-6.

Sze, S.M. *Physics of Semiconductor Devices*, John Wiley & Sons, p. 383-390, 1981.

Thomas et al., "Annealing of Ion Implantation Damage in SiC Using a Graphite Mask", Material Research Society Symposium Y Proceedings vol. 572, Spring 1999, pp. 45-50.

Treu et al. "A Surge Current Stable and Avalanche Rugged SiC Merged pn Schottky Diode Blocking 600V Especially Suited for PFC Applications" *Materials Science Forum* vols. 527-529: 1155-1158 (2006).

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

V.V. Afanasev, M. Bassler, G. Pensl, and M. Schulz, "Intrinsic SiC/SiO$_2$ Interface States," *Phy. Stat. Sol. (a)*, vol. 162, pp. 321-337, 1997.

Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.

Vassilevski et al., "Protection of selectively implanted and patterned silicon carbide surfaces with graphite capping layer during post-implantation annealing,"Institute of Physics Publishing, Semicond. Sci. Technol. 20 (2005) 271-278.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.

Williams et al. "Passivation of the 4H-SiC/SiO$_2$ Interface with Nitric Oxide," *Materials Science Forum*. vols. 389-393 (2002), pp. 967-972.

Xu et al. "Improved Performance and Reliability of N$_2$O-Grown Oxynitride on 6H-SiH," *IEEE Electron Device Letters*. vol. 21, No. 6, Jun. 2000, p. 298-300.

Y. Li et al., "High Voltage (3 kV) UMOSFETs in 4H-SiC," *Transactions on Electron Devices*, vol. 49, No. 6, Jun. 2002.

Y. Wang, C. Weitzel, and M. Bhatnagar, "Accumulation-Mode SiC Power MOSFET Design Issues," *Materials Science Forum*, vols. 338-342, pp. 1287-1290.

Yilmaz, "Optimization and Surface Charge Sensitivity of High Voltage Blocking Structures with Shallow Junctions,"IEEE Transactions on Electron Devices, vol. 38, No. 3, Jul. 1991, pp. 1666-1675.

Zhang et al., "A 10-kV Monolithic Darlington Transistor with βforced of 336 in 4H-SiC," IEEE Electron Device Letters, vol. 30, No. 2, pp. 142-144, XP011240662.

Zhang et al.; *Design and Fabrications of High Voltage IGBTs on 4H-SiC*; 2006 IEEE Proceedings of the 18$^{th}$ International Symposium on Power Semiconductor Devices & ICs, Napels, Italy Jun. 4-8, 2006, pp. 1-4.

International Search Report and the Written Opinion of the International Searching Authority Corresponding to International Application No. PCT/US2011/027383; Date of Mailing: May 20, 2011; 8 Pages.

International Search Report and the Written Opinion of the International Searching Authority Corresponding to International Application No. PCT/US2011/031150; Date of Mailing: Jun. 20, 2011; 10 Pages.

Notification Concerning Transmittal of International Preliminary Report on Patentability Corresponding to International Application No. PCT/US2010/035709; Date of Mailing: Dec. 15, 2011; 8 Pages.

Notification Concerning Transmittal of International Preliminary Report on Patentability Corresponding to International Application No. PCT/US2010/035713; Date of Mailing: Dec. 15, 2011; 8 Pages.

European Communication Corresponding to Application No. 07 112 298.0; Dated: Jan. 16, 2012; 7 pages.

International Preliminary Report on Patentability Corresponding to International Application No. PCT/US2010/034502; Date of Mailing: Jan. 26, 2012; 12 pages.

Ryu et al. "10 kV, 123 mΩ-cm<2>4H-SiC Power DMOSFETs" *Device Research Conference, 2004. 62$^{nd}$ DRC. Conference Digest*, Jun. 21-23, 2004, Piscataway, NJ, USA, IEEE, Jun. 21, 2004, pp. 47-48. XP010748127.

Tang et al. "High-Voltage Implanted-Emitter 4H-SiC BJTS" *IEEE Electron Device Letters*, IEEE Service Center, New York, NY. vol. 23 No. 1. Jan. 1, 2002. XP001112376.

Tang et al. "Hybrid All-Sic MOS-Gated Bipolar Transistor (MGT)" *Proceedings of the 14$^{th}$ International Symposium on Power Semiconductor Devices & ICS. ISPSD '02*. Santa Fe, NM Jun. 4-7, 2002; International Symposium on Power Semiconductor Devices & IC's, New York, NY: IEEE, Jun. 4, 2002, pp. 53-56. XP010591564.

* cited by examiner

US 8,193,848 B2

POWER SWITCHING DEVICES HAVING CONTROLLABLE SURGE CURRENT CAPABILITIES

CROSS-REFERENCE TO RELATED APPLICATION

The present application claims priority under 35 U.S.C. §119(e) to U.S. Provisional Patent Application Ser. No. 61/183,214, filed Jun. 2, 2009, the content of which is incorporated herein by reference as if set forth in its entirety.

FIELD OF THE INVENTION

The present invention relates to semiconductor devices and, more particularly, to power semiconductor devices having surge current capabilities.

BACKGROUND

Power Metal Oxide Semiconductor Field Effect Transistors ("MOSFET") are a well known type of semiconductor transistor that may be used as a switching device in high power applications. A power MOSFET may be turned on or off by applying a gate bias voltage to a gate electrode of the device. When a power MOSFET is turned on (i.e., it is in its "on-state"), current is conducted through a channel of the MOSFET. When the bias voltage is removed from the gate electrode (or reduced below a threshold level), the current ceases to conduct through the channel. By way of example, an n-type MOSFET turns on when a gate bias voltage is applied that is sufficient to create a conductive n-type inversion layer in a p-type channel region of the device. This n-type inversion layer electrically connects the n-type source and drain regions of the MOSFET, thereby allowing for majority carrier conduction therebetween.

The gate electrode of a power MOSFET is separated from the channel region by a thin insulating layer. Because the gate of the MOSFET is insulated from the channel region, minimal gate current is required to maintain the MOSFET in a conductive state or to switch the MOSFET between its on state and off state. The gate current is kept small during switching because the gate forms a capacitor with the channel region. Thus, only minimal charging and discharging current ("displacement current") is required during switching, allowing for less complex gate drive circuitry. Moreover, because MOSFETS are unipolar devices in which current conduction occurs solely through majority carrier transport, MOSFETs may exhibit very high switching speeds. The drift region of a power MOSFET, however, may exhibit a relatively high on-resistance, which arises from the absence of minority carrier injection. This increased resistance can limit the forward current density achievable with power MOSFETs.

Most power semiconductor devices are formed of silicon ("Si"), although a variety of other semiconductor materials have also been used. Silicon carbide ("SiC") is one of these alternate materials. Silicon carbide has potentially advantageous semiconductor characteristics including, for example, a wide band-gap, high electric field breakdown strength, high thermal conductivity, high melting point and high-saturated electron drift velocity. Thus, relative to devices formed in other semiconductor materials such as, for example, silicon, electronic devices formed in silicon carbide may have the capability of operating at higher temperatures, at high power densities, at higher speeds, at higher power levels and/or under high radiation densities. Power silicon carbide MOSFETs are known in the art that are used as switching devices in a variety of power applications because of their ability to handle relatively large output currents and support relatively high blocking voltages.

In a number of applications, the amount of current that is carried by a switch can vary significantly. By way of example, the current carried by switches used in the electrical power grid varies based on the fluctuating power demand of the users served by the power grid. Thus, the switches used in the grid must be designed to handle peak current levels, even though the average current levels may be significantly lower than the peak levels. Thus, the ability to handle surge currents is an important requirement for power switching devices. In particular, surge current capability is important for the reliability of the future power grid, due to the presence of power fluctuations and/or short circuits or other failures that can create surge current within the grid.

SUMMARY

Pursuant to embodiments of the present invention, semiconductor switching devices are provided that include a power transistor, a surge current transistor that is coupled in parallel to the power transistor and a driver transistor that is configured to drive the surge current transistor, These devices are configured so that, in their on-state, substantially all of the output current of the device flows through the channel of the power transistor when the voltage across the channel is within a first voltage range, whereas the output current flows through both the surge current transistor and the channel of the power transistor when the voltage across the channel is within a second, higher, voltage range. The surge current transistor may comprise a bipolar junction transistor ("BJT"), the power transistor may comprise a power MOSFET, and the driver transistor may comprise a driver MOSFET. The BJT, the power MOSFET and the driver MOSFET may each comprise a silicon carbide based device.

In some embodiments, these devices may be configured to saturate a surge current flowing through the semiconductor switching device. In such embodiments, the saturation level may be a function of the voltage across the channel of the power MOSFET and a bias voltage that is applied to the gates of the power MOSFET and the driver MOSFET.

In some embodiments, the gate of the power MOSFET may be electrically connected to the gate of the driver MOSFET, the first source/drain region of the power MOSFET may be electrically connected to the collector of the BJT, and the second source/drain region of the power MOSFET may be electrically connected to the emitter of the BJT. The first source/drain region of the driver MOSFET may be electrically connected to the collector of the BJT and the second source/drain region of the driver MOSFET may be electrically connected to a base of the BJT.

In some embodiments, the switching device may comprise an n-type silicon carbide drift layer and a p-type silicon carbide base layer and a silicon carbide p-well that are on the n-type silicon carbide drift layer. An n-type silicon carbide emitter region is provided on the p-type silicon carbide base layer, and a first n-type source/drain region of the driver MOSFET is provided in an upper portion of the silicon carbide p-well. A first n-type source/drain region of the power MOSFET is provided in an upper portion of the silicon carbide p-well. The device may also include a heavily-doped p-type silicon carbide region on the p-type silicon carbide base layer adjacent the n-type silicon carbide emitter region and an electrical connection between the heavily-doped p-type silicon carbide region and the first n-type source/drain region of the driver MOSFET. In such embodiments, the n-type silicon carbide drill layer may act as the collector of the BJT, the second source/drain region of the power MOSFET and the second source/drain region of the driver MOSFET.

Pursuant to further embodiments of the present invention, semiconductor switches are provided that include a first semiconductor device that has a first switching speed and a second semiconductor device that has a second, slower, switching speed. These switches are configured so that substantially all of the output current of the switch flows through the first semiconductor device for a first range of output current levels, whereas the output current flows through both the first and second semiconductor devices for a second, higher, range of output current levels.

In some embodiments, the first semiconductor device may be a unipolar device and the second semiconductor device may be a bipolar device. For example, the first semiconductor device may be a power MOSFET and the second semiconductor device may be BJT. The BJT and the power MOSFET may be implemented in parallel so that the collector of the BJT and the first source/drain region of the power MOSFET form a first common node, and the emitter of the BJT and the second source/drain region of the power MOSFET form a second common node. The power semiconductor switch may also include a driver MOSFET that is configured to provide a base current to a base of the BJT. In some embodiments, the BJT, the power MOSFET and the driver MOSFET may each be a silicon carbide semiconductor device.

Pursuant to still further embodiments of the present invention, power switching devices are provided that include a first wide band-gap MOSFET, a second wide band-gap MOSFET and a wide band-gap BJT. In these devices, the gate of the first MOSFET is electrically connected to the gate of the second MOSFET, and the first source/drain region of the first MOSFET is electrically connected to the first source/drain region of the second MOSFET and to the collector of the BJT. The second source/drain region of the first MOSFET is electrically connected to the emitter of the BJT, and the second source/drain region of the second MOSFET is electrically connected to the base of the BJT.

DETAILED DESCRIPTION

Figure 1:
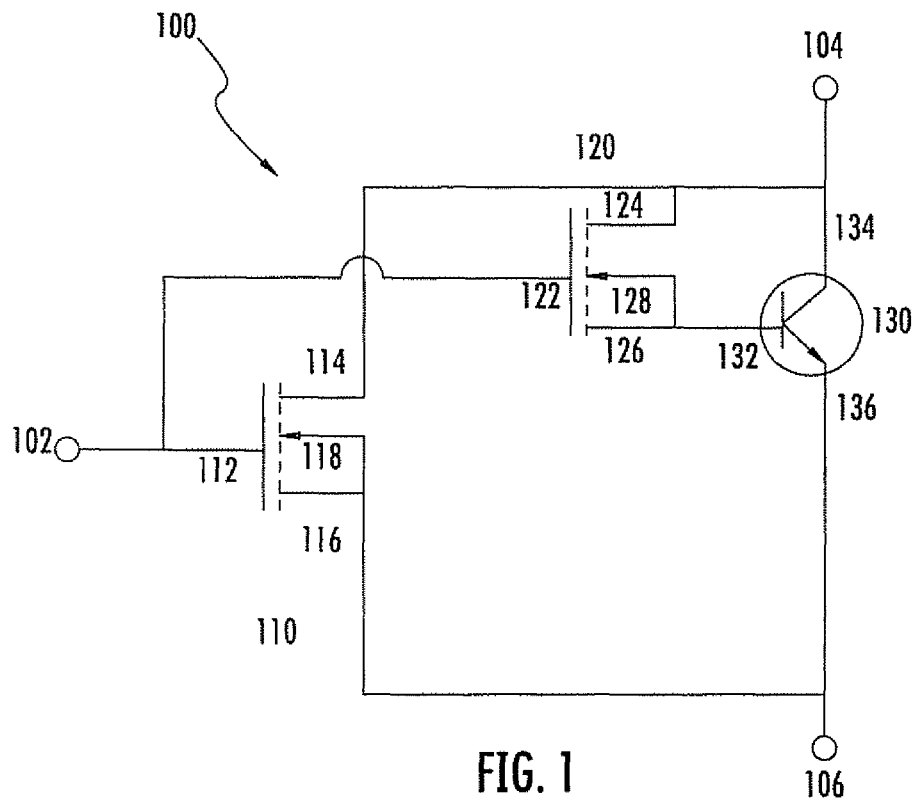
FIG. 1 is a circuit diagram of a controllable surge MOSFET ("CST") according to embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Furthermore, relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope or the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this disclosure and the relevant art and will not be interpreted in an idealized or overly formal sense unless expressly so defined herein.

As used herein, source and drain regions may be generically referred to as "source/drain regions," which is a term used to refer to either a source region or a drain region.

It will likewise be appreciated that the embodiments described herein can be combined in any way and/or combination.

High power silicon carbide MOSFETs are in wide use today for applications requiring high voltage blocking such as voltage blocking of 5,000 volts or more. By way of example, silicon carbide MOSFETs are commercially available that are rated for current densities of 10 A/cm$^2$ or more that will block voltages of at least 10 kV. To form such a high power silicon carbide MOSFET, a plurality of "unit cells" are typically formed, where each unit cell comprises a single MOSFET that includes a gate electrode, a source region and a drain region. In practice, a single gate electrode is typically formed on a first side of a semiconductor substrate that acts as the gate electrode for all of the unit cells. The opposite side of the semiconductor substrate acts as a common drain (or source) for the device. A plurality of source (or drain) regions are interposed within openings in the gate electrode. These source regions are also electrically connected to each other.

As noted above, the gate electrode of a typical high power silicon carbide MOSFET extends across the entire active area of the device, with openings provided in the gate electrode to provide access to the source (or drain) regions of the unit cells. Moreover, in order to increase the rated current of the device, the number of unit cells is typically increased. As the total gate area of the device is a function of the number of unit cells, the size of the active area generally increases as the rated current is increased. As the active area of the silicon carbide MOSFET increases, so does the total area of the gate insulation layer that separates the gate electrode from the underlying channels of each unit cell of the MOSFET.

Unfortunately, it can be difficult to manufacture both silicon carbide substrates and gate insulation layers on silicon carbide substrates that are free from defects. Defects that are present in the silicon carbide substrate and/or in the gate insulation layer can cause a high power silicon carbide MOSFET to fail various specified performance parameters such as, for example, minimum breakdown voltage, current rating, etc. As the size of the active area and the gate insulation layer are increased, the probability that a fatal defect is present may also increase. As such, the manufacturing yield (i.e., the percentage of devices manufactured that meet specifications) for silicon carbide MOSFETs having high current ratings can be relatively low.

Additionally, as discussed above, in certain applications where silicon carbide or other wide band-gap semiconductor MOSFET switches are employed such as, for example, electrical power distribution, the switch must be rated to handle peak current levels that may periodically flow through the switch and/or surge currents that may result from short-circuits in the power grid. The peak surge currents may be, for example, five times or more the average current that flows through the switch. In order to handle these surge currents, the number of unit cells in each MOSFET switch must be increased by a corresponding factor. This can significantly increase the manufacturing cost, and may significantly lower manufacturing yields due to the above described problems that may result clue to defects in the silicon carbide substrate and/or in the gate insulation layer. In addition, under certain bias conditions, power silicon carbide MOSFETs may become uncontrollable in that very small increases in the voltage across the channel may lead to very large increases in the current flow, with no natural saturation of the surge current level. The very high current levels that can flow during such surge conditions can damage or destroy the MOSFET and/or other equipment downstream from the MOSFET switch.

Pursuant to embodiments of the present invention, power switching devices and/or circuit configurations are provided that are capable of handling surge currents are provided. These devices may have extremely fast switching speeds during normal operating conditions (e.g., switching speeds comparable to the speeds of power MOSFETs). Although the switching speeds of the power switching devices according to embodiments of the present invention may be reduced when the devices are conducting surge current levels, even under these switching conditions the device may still exhibit switching speeds that are more than sufficient for power grids and various other applications.

According to some embodiments of the present invention, high power silicon carbide or other wide band-gap MOSFET switches are provided that include a controllable surge current capability. These devices, which are referred to herein as controllable surge MOSFETs or "CSTs", couple a MOS-gated bipolar junction transistor ("BJT") in parallel to the power MOSFET. The MOS-gated BJT may carry little or no current during normal operation of the CST. However, when surge currents are received at the CST, the driver MOSFET of the MOS-gated BJT turns on the BJT, and the surge current is split between the power MOSFET and the BJT. The power CSTs according to embodiments of the present invention may, for example, carry surge currents as high as 100 amps or more. Moreover, the CSTs according to embodiments of the present invention may naturally saturate surge currents, thereby providing a power switch which clamps surge currents, which may protect both the CST itself and downstream equipment from surge current damage.

As known to those of skill in the art, a BJT is a three-terminal device constructed of a doped semiconductor material. A BJT includes two p-n junctions that are formed in close proximity to each other in the semiconductor material. In operation, charge carriers enter a first region of the semiconductor material (which is called the emitter) that is adjacent one of the p-n junctions. Most of the charge carriers exit the device from a second region of the semiconductor material (which is called the collector) that is adjacent the other p-n junction. The collector and emitter are formed in regions of the semiconductor material that have the same conductivity type. A third region of the semiconductor material, known as the base, is positioned between the collector and the emitter and has a conductivity type that is opposite the conductivity type of the collector and the emitter. Thus, the two p-n junctions of the BJT are formed where the collector meets the base and where the base meets the emitter. By flowing a small current through the base of a BJT, a proportionally larger current passes from the emitter to the collector.

A BJT may be a "PNP" device or an "NPN" device. In a PNP BJT, the emitter and collector are formed in p-type regions of the semiconductor material, and the base is formed in an n-type region of the semiconductor that is interposed between the two p-type regions. In an NPN BIT, the emitter and collector are formed in n-type regions of the semiconductor material, and the base is formed in a p-type region of the semiconductor that is interposed between the two n-type regions.

BJTs are current controlled devices in that a BJT is turned "on" (i.e., it is biased so that current flows between the emitter to the collector) by flowing a current through the base of the transistor. For example, in an NPN BJT, the transistor is typically turned on by applying a positive voltage to the base to forward bias the base-emitter p-n junction. When the device is biased in this manner, holes flow into the base of the transistor where they are injected into the emitter. The holes are referred to as "majority carriers" because the base is a p-type region, and holes are the predominant charge carriers in such a region under equilibrium conditions. At the same time, electrons are injected from the emitter into the base, where they diffuse toward the collector. These electrons are referred to as "minority carriers" because electrons are not the predominant charge carrier in the p-type base region under equilibrium conditions.

The base of a BJT is made to be relatively thin in order to minimize the percentage of the minority carriers (i.e., the electrons injected into the base from the emitter in an NPN BJT) that recombine with the majority carriers that flow between the base and the emitter. The collector-base p-n junction is reverse biased by applying a positive voltage to the collector. This facilitates sweeping the electrons that are injected from the emitter into the base to the collector. BJTs are referred to as "bipolar" devices because the emitter-collector current includes both electron and hole current (i.e., both majority and minority carriers). This is in contrast to unipolar devices such as MOSFETs which only include majority carriers. The majority current that flows through the base of a BJT controls the emitter-collector current.

FIG. 1 is a circuit diagram of a CST 100 according to certain embodiments of the present invention. As shown in FIG. 1, the CST 100 includes an n-type power MOSFET 110 such as, for example, a 20 amp silicon carbide MOSFET. The power MOSFET 110 has a gate 112, a drain 114 and a source 116. An NPN power BJT such as, for example, a 20 amp silicon carbide BJT 130 is provided in parallel to the power MOSFET 110 for handling surge currents. The BJT 130 includes a base 132, a collector 134 and an emitter 136. A second n-type silicon carbide MOSFET 120 that has a gate 122, a drain 124 and a source 126 is also provided, which is referred to herein as the driver MOSFET 120. The CST 100 includes a gate terminal 102, a drain terminal 104 and a source terminal 106.

As shown in FIG. 1, the gate 112 of the power MOSFET 110 and the gate 122 of the driver MOSFET 120 are electrically connected to the gate terminal 102 of CST 100. The drain 114 of the power MOSFET 110, the drain 124 of the driver MOSFET 120 and the collector 134 of the BJT 130 are commonly coupled to the drain terminal 104 of CST 100. The source 116 of power MOSFET 110 and the emitter 136 of BJT 100 are commonly coupled to the source terminal 106 of CST 100. The driver MOSFET 120 and the BJT 130 are configured as a Darlington pair so that the channel current of the driver MOSFET 120 drives the base 132 of the BJT 130 through the source 126 of MOSFET 120. As the BJT 130 will have a high current gain, the driver MOSFET 120 may be a relatively small MOSFET as it does not have to provide a large current to drive the BJT 130.

The BJT 130 has a current gain $\beta_{BJT}$. Thus, during surge conditions where the BJT operates in its active region, the transconductance of the CST 100 $g_{m,CST}$ is a function of the transconductance $g_{m,MOSFET}$ of the driver MOSFET 120 and the current gain $\beta_{BJT}$ of the BJT 130. Due to the relatively large current gain of the BJT 130, the transconductance of CST 100 may be quite high. As a result, the forward voltage drop of the CST 100 may remain relatively low, even during surge current conditions.

The CST 100 of FIG. 1 may operate as follows. An external drive circuit (not shown in FIG. 1) is connected to the gate terminal 102 of CST 100. When the external drive circuit applies a bias voltage to the gate terminal 102 of the CST 100 that is greater than the threshold voltage of gate 112 of MOSFET 110, an inversion layer is formed under the gate 112 which acts as a channel 118 that allows current to flow from the drain 104 to the source 106 of power MOSFET 110. However, so long as the drain-source voltage $V_{DS}$ of the power MOSFET 110 (i.e., the voltage drop between drain terminal 104 and source terminal 106) is less than. for example, about 2.5 volts, the driver MOSFET 120 does not provide sufficient current to the base 132 of BJT 130 to turn BJT 130 on. Thus, for drain-source voltages of less than, for example, about 2.5 volts, the CST 100 operates essentially like a power MOSFET. However, when the drain-source voltage exceeds approximately 2.5 volts, the current flow through the channel 128 of the driver MOSFET 120 is sufficient to turn on the BJT 130. At this point, the power MOSFET 110 and the BJT 130 conduct in parallel, and the current flowing through CST 100 is split between these two current paths. In this manner, the BJT 130 can be used to handle surge currents through the CST 100.

The CSTs according to embodiments of the present invention may exhibit a number of advantages as compared to conventional power MOSFETs. First, the power MOSFET 110, the driver MOSFET 120 and the BIT 130 may all comprise silicon carbide devices (or a different wide band-gap semiconductor). Consequently, the above-noted advantages that silicon carbide and other wide band gap semiconductors may have in power applications are achieved with the CSTs according to embodiments of the present invention.

Second, due to its lower on-state drift region resistance, a silicon carbide BJT can typically conduct significantly more current than can a similarly-sized silicon carbide MOSFET. For example, a silicon carbide BJT will typically support current densities 2-5 times (or more) higher than a similarly-sized silicon carbide MOSFET. Thus, the CSTs according to embodiments of the present invention can provide a significant increase in surge current capability as compared to similarly-sized MOSFET switches. For example, assuming that the BJT supports current densities that are four times the current density supported by a similarly sized MOSFET, a CST according to embodiments of the present invention that includes a MOSFET and a similarly sized BJT (thereby resulting in a device that is approximately twice as large as a stand-alone MOSFET) can support a current that is five times higher than the current that can be supported by the stand-alone MOSFET. Thus, the CSTs according to embodiments of the present invention can support very high surge currents with a compact device.

Third, the CSTs according to embodiments of the present invention may operate at high frequencies (i.e., exhibit high switching speeds) during normal operation, as essentially all of the current flows through the power MOSFET of the CST during normal operating conditions and as the BJT is relatively small and hence does not add a large capacitance to the circuit that significantly impacts switching speed. In other words, because the BJT only turns on during surge conditions, it does not substantially affect the switching characteristics of the device under normal operating conditions, and thus the CST acts as a unipolar device under such normal operating conditions. As discussed above, because current conduction in the MOSFET occurs solely through majority carrier transport, the delay associated with the recombination of excess minority carriers that occurs in BJTs is not present in MOSFET devices, allowing for switching speeds that can be orders of magnitude faster than that of BJTs. While the switching speeds of the CSTs according to embodiments of the present invention may be reduced when the CSTs are conducting higher currents due to the bipolar nature of the current flow through the BJT, in many applications, the BJT may conduct current only a small percentage of the time.

Fourth, the CSTs according to embodiments of the present invention may have controllable (clamped) surge current capability with a low voltage drop due to the low saturation voltage of the BJT. This can help the device to survive a short-circuit without thermal failure.

Fifth, the CSTs according to embodiments of the present invention may have a low incremental fabrication cost compared to the cost of fabricating a comparably-rated MOSFET switch. In particular, the fabrication cost of a silicon carbide BJT is much less than the fabrication cost of a similarly-sized silicon carbide MOSFET, and the device yield of for the BJT is typically much higher than the yield for a comparably sized MOSFET due to the absence of a MOS channel and gate dielectric. As BJTs support higher current densities than comparably sized MOSFETs, the size of a CST chip may be much smaller than the size of a MOSFET switch that is designed to handle similar surge current levels.

Figure 2:
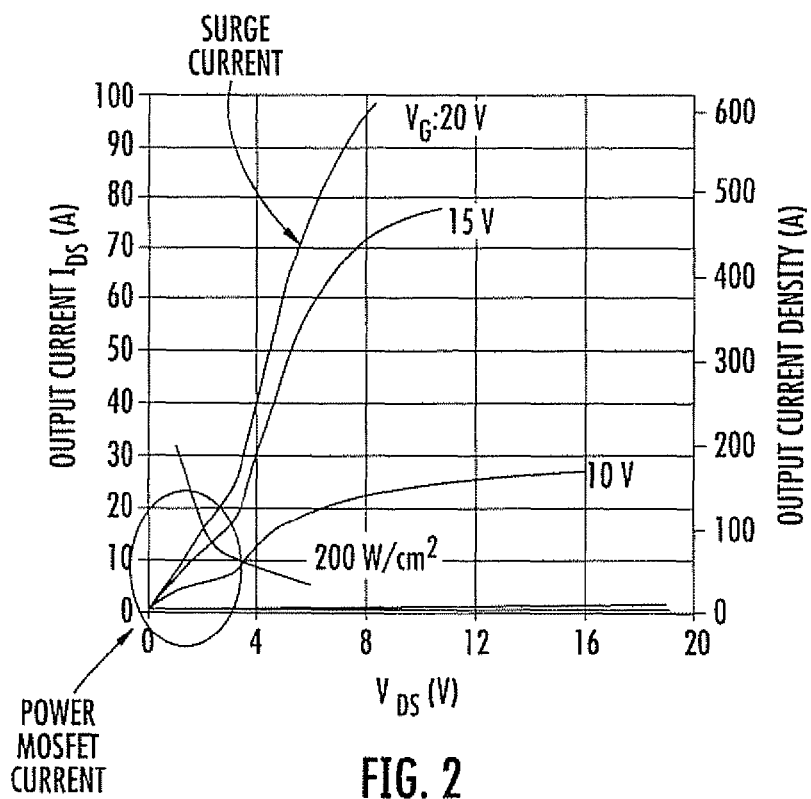
FIG. 2 is a graph showing the measured current that flows through the CST of FIG. 1 as a function of the collector voltage and the gate bias voltage.

FIG. 2 is a graph showing current-voltage (I-V) characteristics of the CST 100 of FIG. 1. As shown in FIG. 2, at a drain-source voltage $V_{DS}$ of less than about 2.5 volts, the CST 100 exhibits the output characteristics of the driver MOSFET 110, showing that at low drain-source voltages, the current through the CST 100 is carried through the channel 118 of the driver MOSFET 110. However, when $V_{DS}$ exceeds about 2.5 volts, the driver MOSFET 120 provides sufficient base current to the BJT 130 to turn the BJT 130 on, at which point the BJT 130 starts to handle the excessive (surge) current through the CST 100.

As shown in FIG. 2, the CST 100 may support a total surge current of about 100 amps at a gate voltage $V_G$ of 20 volts and a forward voltage drop $V_{CE}$ of 8 volts. The total surge current is the sum of the currents through the power MOSFET 110 and the BJT 130, where the BJT 130 conducts about 60 of the 100 amps. The current flowing through the BJT 130 is limited in this case by the wire bonding in the device. FIG. 2 also shows that the surge current is well controlled in response to gate bias (i.e., if the gate voltage $V_G$ is reduced to 10 volts, the surge current drops from about 100 amps to about 22 amps at a forward voltage drop of 8 volts). As is further shown in FIG. 2, the surge current flowing through the CSTs saturates as $V_{DS}$ increases. By way of example, for a gate voltage of 10 volts, the total current $I_{DS}$ through the device saturates at approximately 30 amps. As a result, surge currents are less likely to cause thermal damage to the CST 100, and the CST 100 may protect other downstream components from surge currents.

The 200 W/cm² package power dissipation limit is also shown in FIG. 2. As can be seen, during normal operation (i.e., operation under this limit), the CST 100 exhibits an I-V response that is characteristic of the response of a silicon carbide MOSFET, showing that, at these normal operating conditions, the output current is substantially carried by the power MOSFET 110. However, when surge currents occur which, as shown in FIG. 2, can far exceed the 200 W/cm² line, the I-V response deviates substantially from the characteristic response of a silicon carbide MOSFET, showing that the BJT 130 starts to carry a significant amount of the output current. While the surge currents shown in FIG. 2 clearly exceed the 200 W/cm² package power dissipation limit, these surge currents typically only occur infrequently, and for short periods of time, and hence the CST 100 can typically survive the surge currents without damage.

As is also shown in FIG. 2, the forward voltage drop at surge conduction can remain at a relatively low value (e.g., 8 volts for a surge current of 100 amps) as a result of the high transconductance of the CST 100. In contrast, mathematical calculation shows that the forward voltage drop during surge conditions can exceed 20 volts if the entire 100 amp surge current were instead conducted by a single MOSFET that has a plan view area equal to the combined areas of the power MOSFET 110 and the BJT 130 of the CST 100. This reduction in forward voltage drop from >20 volts to 8 volts can significantly reduce the thermal dissipation and thermal stress on the package.

Figure 3:
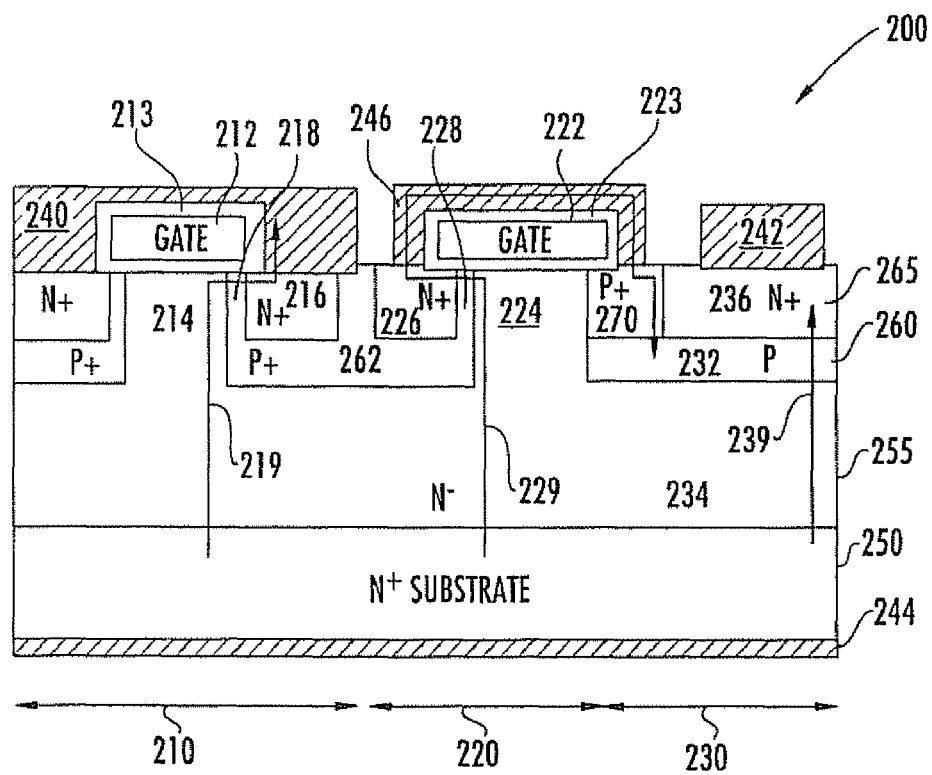
FIG. 3 is a schematic cross-sectional diagram of an embodiment of the CST of FIG. 1 where the device is implemented as a monolithic structure having a planar gate electrode structure.
Figure 4:
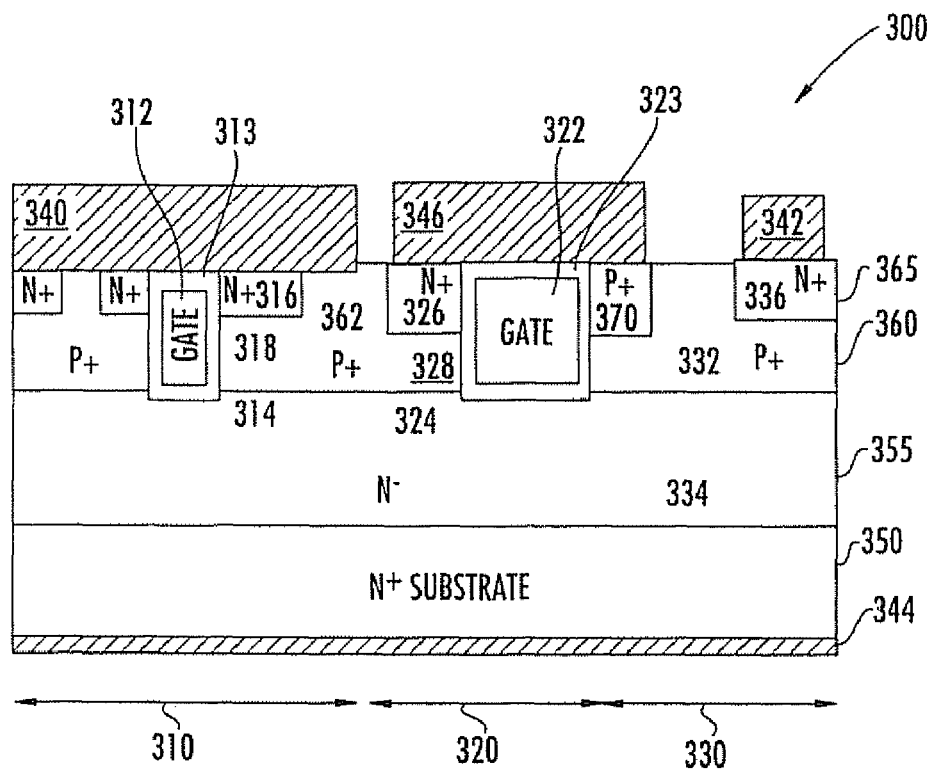
FIG. 4 is a schematic cross-sectional diagram of another embodiment of the CST of FIG. 1 where the device is implemented as a monolithic structure having a trench gate electrode structure.
Figure 5:
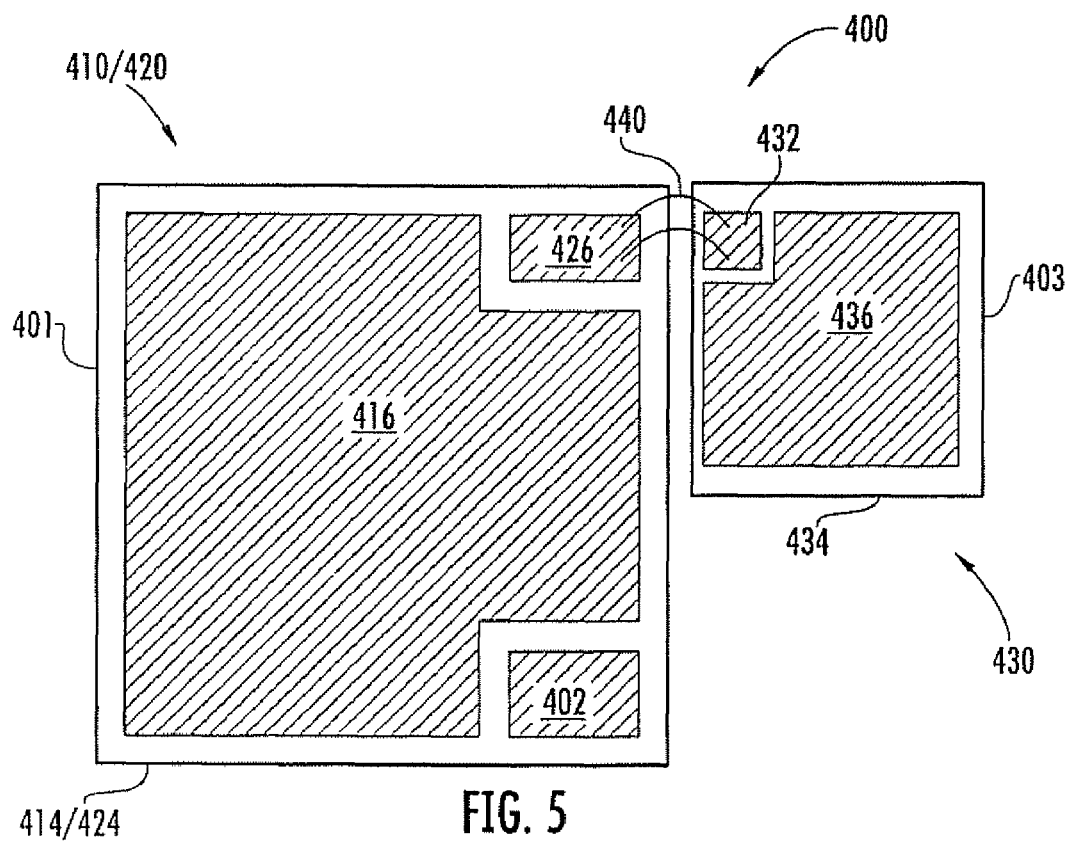
FIG. 5 is a plan view of yet another embodiment of the CST of FIG. 1 where the device is implemented as a hybrid structure.

CSTs according to embodiments of the present invention can be fabricated as either monolithic devices or as hybrid devices. FIGS. 3 and 4 are schematic cross-sectional illustrations of two exemplary monolithic implementations of CSTs according to embodiments of the present invention, while FIG. 5 is a plan view of hybrid CST according to embodiments of the present invention.

As shown in FIG. 3, pursuant to certain embodiments of the present invention, a CST 200 having the circuit diagram of CST 100 of FIG. 1 may be implemented as a monolithic device on a single substrate. As shown in FIG. 3, the CST 200 includes a power MOSFET 210, a driver MOSFET 220 and a BJT 230. All three devices 210, 220, 230 are formed on the same bulk single crystal n-type silicon carbide substrate 250. In some embodiments, the substrate 250 may be omitted. An if silicon carbide drift layer 255 is provided on the substrate 250. A p-type silicon carbide layer 260 is provided in an upper surface of the n drift layer 255. At least part of the p-type silicon carbide layer 260 may be heavily doped (p⁺). As discussed below, the p-type silicon carbide layer 260 may act as the base 232 of the BIT 230 and may also be used to form a p-well 262 in which the source regions of the MOSFETs 210 and 220 are formed. A heavily-doped (n⁺) n-type silicon carbide layer 265 is formed in upper regions of the p-type silicon carbide layer 260. Additionally, a second heavily doped (p⁺) p-type silicon carbide layer 270 is provided on a portion of the p-type silicon carbide layer 260. All of the layers 255, 260, 265 and 270 may comprise 4H—SiC layers.

As is further shown in FIG. 3, the heavily-doped (n⁺) n-type silicon carbide layer 265 comprises regions 216 and 226 which act as the sources of the MOSFETS 210 and 220, respectively, and a region 236 that acts as the emitter of the BIT 230. Portions of the n⁻ drift layer 255 act as the drain regions 214 and 224 of the MOSFETs 210 and 220, respectively, and the n⁻ drift layer 255 also acts as the collector 234 of the BIT 230. A channel region 218 is provided in the p-well 262 between the source region 216 and the drain region 214 of MOSFET 210, and a channel region 228 is provided between the source region 226 and the drain region 224 of MOSFET 220. An insulated gate electrode 212 of power MOSFET 210 is formed on the n drift layer 255, the p-well 262 and the source region 216. The gate 212 may comprise, for example, a doped polysilicon or silicon carbide layer, and the insulating layer 213 surrounding the gate 212 may comprise, for example, silicon dioxide. Likewise, an insulated gate 222 of driver MOSFET 220 is formed on the n⁻ drift layer 255, the p-well 262, the source region 226 and the second heavily doped (p⁺) p-type silicon carbide layer 270. The gate 222 may comprise, for example, a doped polysilicon or silicon carbide layer, and the insulating layer 223 surrounding the gate 222 may comprise, for example, silicon dioxide. A metal layer 246 or other conductive layer electrically connects the source region 226 of driver MOSFET 220 to the base 232 of BJT 230 through the second heavily doped (p⁺) p-type silicon carbide layer 270.

An ohmic contact 240 (e.g., a metal layer) is formed on the n⁺ source region 216 (in CST 200, the ohmic contact 240 also electrically connects source region 216 to the source region of a neighboring unit cell) and an ohmic contact 242 is formed on the emitter region 236 of BJT 230. The ohmic contacts 240 and 242 may be electrically connected to each other by a conductive line, wire, via or the like (not shown in FIG. 3) to form the source terminal 206 of the CST 200. An ohmic contact 244 is formed on the back side of the n⁺ silicon carbide substrate 250 that acts as the drain terminal 204 of the CST 200. The gate electrodes 212 and 222 are electrically connected to each other by a conductive line, wire, via or the like (not shown in FIG. 3) to form the gate terminal 202 of the CST 200.

With regard to the carrier concentrations, the p⁺ and n⁺ conductivity type regions and epitaxial layers described above may be as heavily doped as possible without causing excessive fabrication defects. Suitable dopants for producing the p-type silicon carbide regions include aluminum, boron or gallium. Suitable dopants for producing the n-type silicon carbide regions include nitrogen and phosphorus.

Operation of the CST 200 will now be discussed. When a bias voltage that exceeds the threshold voltage of the power MOSFET 210 is applied to the gate 212, an n-type inversion layer is created in the channel 218, and an electron current 219 flows across the channel 218 of MOSFET 210. This current comprises the current flowing from the source 106 to the drain 104 of the CST 100 of FIG. 1. As the current flow through the device increases, the drain-source voltage $V_{DS}$ of the driver MOSFET 220 increases. When $V_{DS}$ exceeds about 2.5 volts, an electron current 229 flows from the source 226 to the drain 224 of driver MOSFET 220 into the base 232 of BJT 230. This electron current 229 turns on the BJT 230. In response to this electron current 229, an electron current 239 flows from the collector 234 of BJT 230 (i.e., substrate 250 in FIG. 3) to the emitter 236 of BJT 230 (i.e., SiC region 265 in FIG. 3) through the n' silicon carbide layer 255 and the base 232. Thus, once the driver MOSFET 220 and the BJT 230 turn on, the current through the device is split between the power MOSFET 210 and the BJT 230, with the BJT 230 handling a majority of the current as the current density increases.

FIG. 4 is a cross-sectional diagram of a CST 300 according to embodiments of the present invention that has a trench gate structure. The CST 300 may have the circuit diagram of CST 100 of FIG. 1. As shown in FIG. 4, the CST 300 is implemented as a monolithic device on a bulk single crystal n-type silicon carbide substrate 350, and includes a power MOSFET 310, a driver MOSFET 320 and a BJT 330. It will also be appreciated that, in some embodiments, the substrate 350 may be omitted.

As shown in FIG. 4, an if silicon carbide drift layer 355 is provided on the substrate 350. A heavily doped (p⁺) p-type silicon carbide layer 360 is provided in an upper surface of the n⁻ drift layer 355. At least part of the p-type silicon carbide layer 360 may be heavily doped (p⁺). A portion 332 of the p-type silicon carbide layer 360 acts as the base of the BJT 330, while a portion 362 of the p-type silicon carbide layer 360 is used to form a p-well in which the source regions 316, 326 of the MOSFETs 310 and 320 are formed. A heavily-doped (n⁺) n-type silicon carbide layer 365 is formed in upper regions of the p-type silicon carbide layer 360. Additionally, a heavily doped (p⁺) p-type silicon carbide layer 370 is provided on a portion of the p-type silicon carbide layer 360. All of the layers 355, 360, 365 and 370 may comprise 4H—SiC layers.

As is further shown in FIG. 4, the heavily-doped (n⁺) n-type silicon carbide layer 365 comprises regions 316 and 326 which act as the sources of the MOSFETS 310 and 320, respectively, and a region 336 that acts as the emitter of the BJT 330. Upper portions of the n⁻ drift layer 355 act as the drain regions 314 and 324 of the MOSFETs 310 and 320, respectively, and the n⁻ drift layer 355 also acts as the collector 334 of the BJT 330.

An insulated gate electrode 312 of power MOSFET 310 is formed to extend through the p-type silicon carbide layer 360 and into an upper portion of the n⁻ drift layer 355. The gate 312 may comprise a silicon carbide layer, and the insulating layer 313 surrounding the gate 312 may comprise, for example, silicon dioxide. Likewise, an insulated gate electrode 322 of driver MOSFET 320 is formed to extend through the p-type silicon carbide layer 360 and into an upper portion of the if drift layer 355. The gate 322 may comprise a silicon carbide layer, and the insulating layer 323 surrounding the gate 322 may comprise, for example, silicon dioxide. A channel region 318 is provided in the p-well 362 between the source region 316 and the n⁻ drift layer 355 (which acts as the drain region 314 of MOSFET 310), and a channel region 328 is provided between the source region 326 and the n⁻ drift layer 355 (which also acts as the drain region 324 of MOSFET 320). A metal layer 346 electrically connects the source region 326 of driver MOSFET 320 to the base 332 of BJT 330 through the second heavily doped (p⁺) p-type silicon carbide layer 370.

An ohmic contact 340 is formed on the n⁺ source region 316, and an ohmic contact 342 is formed on the emitter region 336 of BJT 330. The ohmic contacts 340 and 342 may be electrically connected to each other by a conductive line, wire, via or the like (not shown in FIG. 4) to form the source terminal 306 of the CST 300. An ohmic contact 344 is formed on the back side of the n⁺ silicon carbide substrate 350 that acts as the drain terminal 304 of the CST 300. The gate electrodes 312 and 322 are electrically connected to each other by a conductive line, wire, via or the like (not shown in FIG. 4) to form a gate terminal 302 of the CST 300.

Operation of the CST 300 may be similar to the operation of CST 200 discussed above. and hence will not be repeated here.

While FIGS. 3 and 4 may operate as stand-alone devices, it will be appreciated that in typical applications the devices depicted in FIGS. 3 and 4 will comprise unit cells of a larger, high power switch that has increased current carrying and voltage blocking capability. It will be appreciated that to form such a high power CST, a plurality of the CSTs 200 or 300 would be implemented in parallel. In some embodiments, the power MOSFETs 210 or 310 may be spatially separated from the driver MOSFETs 220 or 320 and/or the BJTs 230 or 330 while, in other embodiments, the transistors may be intermixed throughout the device. In either case, the combination of an individual power MOSFET 210 (or 310), an individual driver MOSFET 220 (or 320) and an individual BJT 230 (or 330) may functionally be viewed as a unit cell of the high power CST.

While FIGS. 3 and 4 illustrate the structure of n-channel CSTs 200 and 300, respectively, according to embodiments of the present invention, it will be appreciated that p-channel CSTs may be provided pursuant to further embodiments of the present invention. For example, in exemplary embodiments, unit cells of p-channel CSTs may be provided that have the same structure as shown in FIG. 3 or 4, except that the polarity of each of the semiconductor layers is reversed.

FIGS. 3 and 4 illustrate CSTs according to embodiments of the present invention that are implemented as monolithic devices that are formed on a single substrate. According to further embodiments of the present invention, a CST may be implemented as a hybrid device that comprises two or more chips. FIG. 5 is a plan view of one such hybrid CST 400 according to embodiments of the present invention.

As shown in FIG. 5, the CST 400 comprises a first semiconductor chip 401 and a second semiconductor chip 403. The first semiconductor chip 401 includes a power MOSFET 410 that has a source 416 that comprises most of the top surface of the chip 401 and a drain 414 that comprises the backside (substrate side) of the chip 401. The chip 401 further includes a driver MOSFET 420 that has a source 426 that comprises an upper right corner of the top surface of the chip 401 and a drain 424 that is common with the drain 414 of power MOSFET 410 and thus comprises the backside (substrate side) of the chip 401.

The second semiconductor chip 403 comprises a BJT 430 that includes a base 432, a collector 434 and an emitter 436. As shown in FIG. 5, most of the top surface of chip 403 comprises the emitter 436 of BJT 430, with the remaining portion of the top surface of the chip comprises the base 432 of the BJT 430. The collector 434 comprises the backside (substrate side) of the chip 403. An electrical connection 440 (shown in FIG. 6 as a pair of wires) is provided between the source 426 of the drive MOSFET 420 and the base 432 of BJT 430 to allow the driver MOSFET 420 to provide a drive current to the BJT 430.

Figure 6:
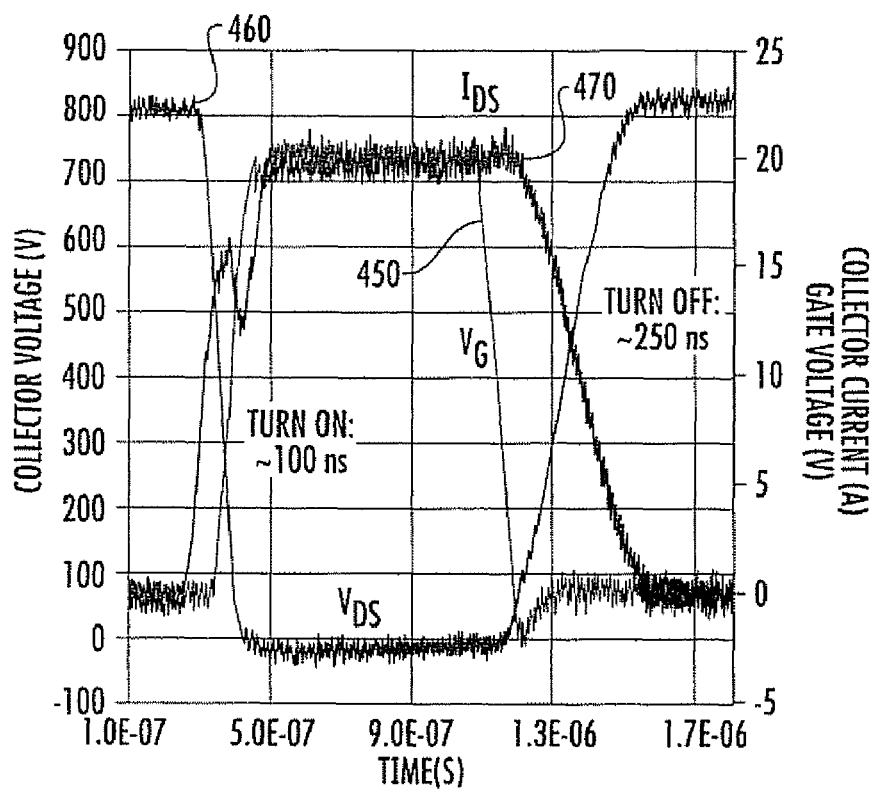
FIG. 6 is a graph that illustrates the measured switching time of a controllable surge MOSFET according to embodiments of the present invention.

The CSTs according to embodiments of the present invention may also exhibit high switching speeds, even though the devices include a bipolar junction transistor. This can be seen in FIG. 6, which is a graph that illustrates the measured switching time of the CST 200 of FIG. 3. In FIG. 6, curve 450 illustrates the bias voltage $V_G$ that is applied to the gate terminal of the CST as a function of time, curve 460 illustrates the drain-source voltage $V_{DS}$ of the CST as a function of time, curve 470 illustrates the collector current ($I_{DS}$) as a function of time. As shown in FIG. 6, a bias voltage $V_G$ of 20 volts (curve 450) is applied to the gate terminal of the CST. In response thereto, the drain-source voltage $V_{DS}$ (curve 460) is driven to nearly zero and the collector current $I_{DS}$ (curve 470) starts to flow. As shown in FIG. 6, the time for the CST to turn on is approximately 100 nanoseconds. Thereafter, the bias voltage $V_G$ is removed (curve 450) and, in response thereto, the drain-source voltage $V_{DS}$ (curve 460) increases to over 20 volts, and the collector current $I_{DS}$ (curve 470) shuts off. As shown in FIG. 6, the time for the CST to turn-off is approximately 250 nanoseconds.

Thus FIG. 6 illustrates that the CST may have a theoretical switching speed on the order of 350 nanoseconds, which corresponds to a switching frequency of nearly 3 MHz. While actual switching speeds are typically an order of magnitude less than the theoretical switching speed, this still indicates a switching frequency on the order of 300 kHz, which far exceeds the 20 kHz switching frequency that are typically required for power grid switching applications. These high switching speeds may be obtained by the CSTs according to embodiments of the present invention because the BJT included therein acts almost as a unipolar device, and hence the delay associated with the recombination of excess minority carriers that occurs in most BJTs is less of an issue in the CSTs according to embodiments of the present invention.

Figure 7:
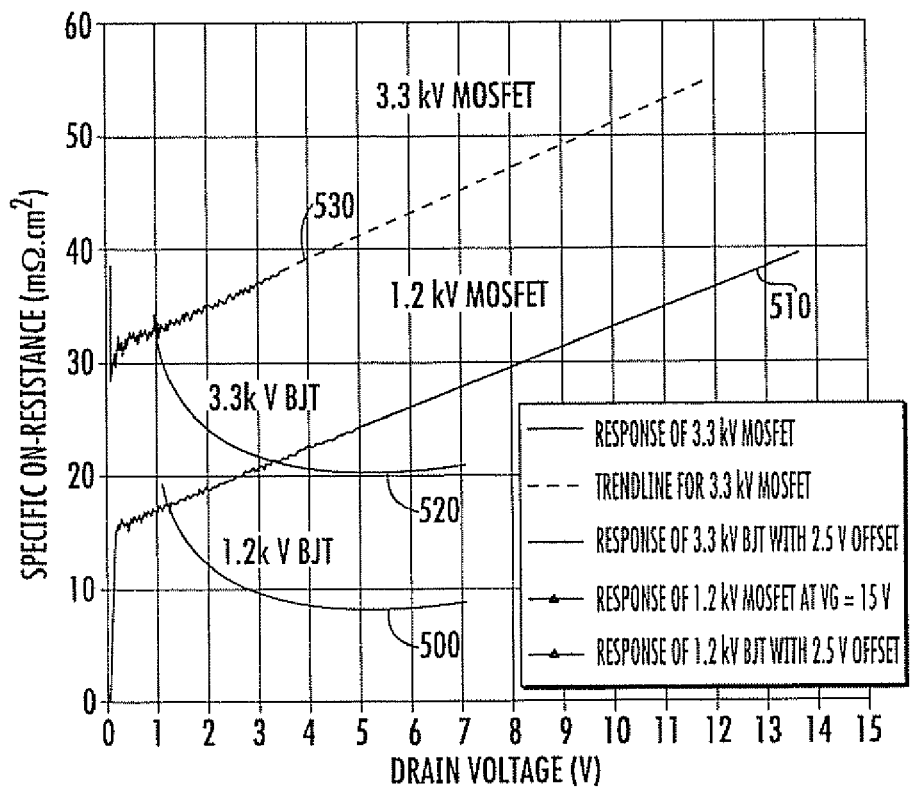
FIG. 7 is a graph illustrating the on-state resistance for comparably-rated silicon carbide BJTs and MOSFETs.

FIG. 7 is a graph illustrating the specific on-state resistance ($R_{sp,on}$) for comparable BJTs and MOSFETs. In particular, FIG. 7 shows the specific on-state resistance for a 1.2 kV MOSFET as compared to the specific on-state resistance of a 1.2 kV BJT as a function of the drain voltage, and further shows the specific on-state resistance of a 3.3 kV MOSFET as compared to the specific on-state resistance of a 3.3 kV BJT as a function of the drain voltage $V_{DS}$. In particular, curve 500 is a graph of $R_{sp,on}$ for a 1.2 kV SiC BJT with a 2.5 volt offset, while curve 510 is a graph of $R_{sp,on}$ for a 1.2 kV SiC MOSFET with a gate voltage $V_G$ of 15 volts. Curve 520 is a graph of $R_{sp,on}$ for a 3.3 kV SiC BJT with a 2.5 V offset, while curve 530 is a graph of $R_{sp,on}$ for a 3.3 kV SiC MOSFET. The dashed extension of curve 530 represents a trend line for the 3.3 kV SIC MOSFET.

As shown in FIG. 7, at low drain voltages, the specific on-state resistance of each power MOSFET is less than the specific on-state resistance of its comparably-rated BJT. However, as the drain voltage increases, this relationship reverses, such that the specific on-state resistance of the BJT is less than the specific on-state resistance of the comparably-rated MOSFET at drain voltages above about 3.5 volts (once the offset is accounted for). The ratio of the current that passes through the power MOSFET versus through the BJT of the CSTs according to embodiments of the present invention varies with the ratio of the specific on-state resistances of the MOSFET and BJT. Thus, FIG. 7 shows that at low drain voltages, the current will be completely or at least primarily carried by the power MOSFET, but at higher drain voltages, the BJT will carry an increasingly larger percentage of the current.

Figure 8:
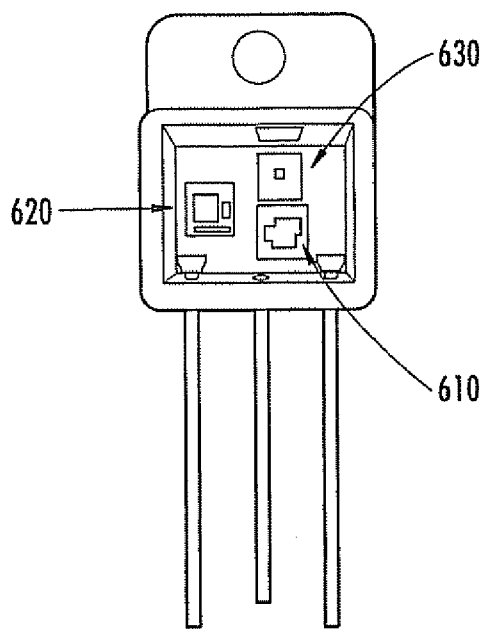
FIG. 8 is a photograph of a CST power switch according to certain embodiments of the present invention.

FIG. 8 illustrates a CST 600 according to certain embodiments of the present invention that includes a 20 amp power silicon carbide MOSFET 610, a driver silicon carbide MOSFET 620, and a 20 amp silicon carbide BJT 630. Each of these transistors 610, 620, 630 has a 1600 volt blocking voltage. The chip sizes for the power MOSFET 610 and the BIT 630 are 4×4 mm² and 3.5×3.5 mm², respectively.

Thus, pursuant to some embodiments of the present invention, semiconductor switching devices are provided that include a wide band-gap power MOSFET, a wide band-gap BJT coupled in parallel to the power MOSFET, and a wide band-gap driver MOSFET having a channel that is coupled to the base of the BJT. Substantially all of the on-state output current of the semiconductor switching device flows through the channel of the power MOSFET when a voltage across the channel of the power MOSFET is within a first voltage range, which range may correspond, for example, to the voltages expected across the channel during normal operation. In contrast, the semiconductor switching device is further configured so that in the on-state the output current flows through both the BJT and the channel of the power MOSFET when the voltage across the channel of the power MOSFET is within a second, higher voltage range.

Pursuant to further embodiments of the present invention, power semiconductor switches are provided that include a first wide band-gap semiconductor device that has a first switching speed and a second wide band-gap semiconductor device that has a second switching speed that is slower than the first switching speed. These switches are configured so that substantially all of the output current of the device flows through the first wide band-gap semiconductor device for a first range of output current levels and so that the output current of the device flows through both the first and second wide band-gap semiconductor devices for a second range of output current levels that are higher than the output current levels in the first range of output current levels.

While the present invention has been primarily described above with respect to silicon carbide MOSFETs that include a MOS-gated &IT surge current path, it will be appreciated that in other embodiments the device could comprise a wide band-gap semiconductor other than silicon carbide such as, for example, gallium nitride, zinc selenide or any other II-VI or III-V wide band gap compound semiconductor. Herein, the term wide band-gap encompasses any semiconductor having a band-gap of at least 1.4 eV. Likewise, it will be appreciated that, in other embodiments, wide band-gap power transistors could have gate insulation layers that are not oxide layers. Accordingly, it will be appreciated that embodiments of the present invention may include MISFET transistors that do not include oxide layers, and that the present invention is not limited to devices that include MOSFET transistors.

As discussed above, the CSTs according to embodiments of the present invention may facilitate handling surge currents, and may also naturally saturate surge currents. Herein, the term "surge current" refers to a current that is more than twice the current rating of the power transistor of the CST (e.g., the power MOSFET of the above-described embodiments). As is known to those of skill in the art, the current rating of a transistor is the maximum channel current that does not exceed the package power dissipation limit of the transistor package.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention, Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor switching device, comprising:
   a wide band-gap power transistor;
   a second wide band-gap transistor coupled in parallel with the wide band-gap power transistor; and
   a wide band-gap driver transistor that is configured to provide a base current to the second wide band-gap transistor;
   wherein a gate of the wide band-gap power transistor, a gate of the wide band-gap driver transistor and a contact for an emitter of the second wide band-gap transistor are on a first side of the semiconductor switching device, and wherein a contact for a collector of the second wide band-gap transistor is on a second side of the semiconductor switching device that is opposite the first side; and
   wherein a first current path length between a source contact of the wide band-gap power transistor and a drain contact of the wide band-gap power transistor is substantially the same as a second current path length between the contact for the emitter of the second wide band-gap transistor and the contact for the collector of the second wide band-gap transistor.

2. The semiconductor switching device of claim 1, wherein the semiconductor switching device is configured so that in its on-state substantially all of an output current of the semiconductor switching device flows through a channel of the wide band-gap power transistor when a drain-source voltage of the wide band-gap power transistor is within a first voltage range; and
   the semiconductor switching device is further configured so that in its on-state the output current flows through both the second wide band-gap transistor and the channel of the wide band-gap power transistor when the drain-source voltage of the wide band-gap power transistor is within a second voltage range having voltages that are higher than the voltages in the first voltage range.

3. The semiconductor switching device of claim 2, wherein the wide band-gap power transistor comprises a wide band-gap power MOSFET, wherein the wide band-gap driver transistor comprises a wide band-gap driver MOSFET and the second wide band-gap transistor comprises a wide band-gap bipolar junction transistor ("BJT"), and wherein the semiconductor switching device is configured to saturate a surge current flowing through the semiconductor switching device.

4. The semiconductor switching device of claim 3, wherein the saturation level is a function of a drain-source voltage of the wide band-gap power MOSFET and a bias voltage that is applied to the gates of the wide band-gap power MOSFET and the wide band-gap driver MOSFET.

5. The semiconductor switching device of claim 1, wherein the second wide band-gap transistor, the wide band-gap power transistor and the wide band-gap driver transistor each comprise a silicon carbide based device.

6. The semiconductor switching device of claim 2, wherein the second wide band-gap transistor, the wide band-gap power MOSFET and the wide band-gap driver MOSFET each comprise a silicon carbide based device, and wherein a gate of the wide band-gap power MOSFET is electrically connected to a gate of the wide band-gap driver MOSFET, wherein a first source/drain region of the wide band-gap power MOSFET is electrically connected to a the collector of the second wide band-gap transistor, and wherein a second source/drain region of the wide band-gap power MOSFET is electrically connected to the emitter of the second wide band-gap transistor.

7. The semiconductor switching device of claim 6, wherein a first source/drain region of the wide band-gap driver MOSFET is electrically connected to the collector of the second wide band-gap transistor and a second source/drain region of the wide band-gap driver MOSFET is electrically connected to a base of the second wide band-gap transistor.

8. The semiconductor switching device of claim 2, wherein the semiconductor switching device comprises:
   an n-type silicon carbide drift layer;
   a p-type silicon carbide base layer and a p-type silicon carbide p-well on the n-type silicon carbide drift layer;
   an n-type silicon carbide emitter region on the p-type silicon carbide base layer;
   a first n-type source/drain region of the wide band-gap driver MOSFET in an upper portion of the silicon carbide p-well; and
   a first n-type source/drain region of the wide band-gap power MOSFET in an upper portion of the silicon carbide p-well.

9. The semiconductor switching device of claim 8, wherein the switching device further comprises:
a heavily-doped p-type silicon carbide region on the p-type silicon carbide base layer adjacent the n-type silicon carbide emitter region; and
an electrical connection between the heavily-doped p-type silicon carbide region and the first n-type source/drain region of the wide band-gap driver MOSFET.

10. The semiconductor switching device of claim 9, wherein the n-type silicon carbide drift layer comprises the collector of the second wide band-gap transistor, the second source/drain region of the wide band-gap power MOSFET and the second source/drain region of the wide band-gap driver MOSFET.

11. The semiconductor switching device of claim 1, wherein the collector of the wide band-gap BJT comprises a semiconductor layer that is directly on an underlying semiconductor substrate.

12. The semiconductor switching device of claim 1, wherein the semiconductor switching device comprises a monolithic device on a single semiconductor substrate.

13. A power semiconductor switch that conducts an output current when in an on-state, comprising:
a silicon carbide drift layer having a first conductivity type;
a silicon carbide base layer on the silicon carbide drift layer, the silicon carbide base layer having a second conductivity type that is different than the first conductivity type;
a silicon carbide well having the second conductivity type on the silicon carbide drift layer;
a silicon carbide emitter region having the first conductivity type on the silicon carbide base layer opposite the silicon carbide drift layer;
a first source/drain region having the first conductivity type in an upper portion of the silicon carbide well that is opposite the silicon carbide drift layer; and
a second source/drain region having the first conductivity type in the upper portion of the silicon carbide well;
wherein the first source/drain region and the silicon carbide drift layer are part of a unipolar wide band-gap semiconductor device that has a first switching speed;
wherein the silicon carbide base layer, the silicon carbide emitter region and the silicon carbide drift layer comprise, respectively, the base, emitter and collector of a wide band-gap bipolar junction transistor ("BJT") that has a second switching speed that is slower than the first switching speed;
wherein the power semiconductor switch is configured so that the output current flows through the unipolar wide band-gap semiconductor device for a first range of output current levels; and
the power semiconductor switch is further configured so that the output current flows through both the unipolar wide band-gap semiconductor device and the wide band-gap BJT for a second range of output current levels that are higher than the output current levels in the first, range of output current levels,
wherein the unipolar wide band-gap semiconductor device and the wide band-gap BJT are both vertical devices.

14. The power semiconductor switch of claim 13, wherein the unipolar wide band-gap semiconductor device comprises a power MOSFET that has a gate terminal and a first source/drain region contact on a first side of the device and a second source/drain region contact that is on a second side of the device that is opposite the first side of the device, and wherein the wide band-gap BJT has a base and a second contact on the first side of the device and a third contact that is on the second side of the device.

15. The power semiconductor switch of claim 14, wherein the BJT and the power MOSFET are implemented in parallel so that the second contact of the wide band-gap BJT and the first source/drain region contact of the power MOSFET form a first common node, and the third contact of the BJT and the second source/drain region contact of the power MOSFET form a second common node.

16. The power semiconductor switch of claim 15, further comprising a driver MOSFET that is configured to provide a base current to a base of the BJT.

17. The power semiconductor switch of claim 16, wherein the BJT, the power MOSFET and the driver MOSFET each comprise a silicon carbide semiconductor device.

18. The power semiconductor switch of claim 13, wherein n-type silicon carbide drift layer comprises the collector of the wide band-gap BJT, and wherein the n-type silicon carbide drift layer is directly on an underlying semiconductor substrate.

19. The power semiconductor switch of claim 16, further comprising a conductive element that is at least partly external to the base of the BJT that electrically connects a source/drain region of the driver MOSFET to the base of the BJT.

20. The power semiconductor switch of claim 13, wherein a first current path length between a source contact of the unipolar wide band-gap semiconductor device and a drain contact of the wide band-gap semiconductor device is substantially the same as a second current path length between the contact for the emitter of the wide band-gap BJT and the contact for the collector of the wide band-gap BJT.

21. A power switching device, comprising:
a first wide band-gap MISFET having a gate, a first source/drain region and a second source/drain region;
a second wide band-gap MISFET having a gate, a first source/drain region and a second source/drain region; and
a wide band-gap bipolar junction transistor ("BJT") having a base, a collector and an emitter;
wherein the gate of the first wide band-gap MISFET is electrically connected to the gate of the second wide band-gap MISFET;
wherein the first source/drain region of the first wide band-gap MISFET is electrically connected to the first source/drain region of the second wide band-gap MISFET and to the collector;
wherein the second source/drain region of the first wide band-gap MISFET is electrically connected to the emitter; and
wherein the second source/drain region of the second wide band-gap MISFET is electrically connected to the base,
wherein the power switching device comprises a vertical device in which the gates of the first and second wide band-gap MISFETs are on a first side of the power switching device and wherein the contact for the collector is on a second side of the power switching device that is opposite the first side of the device, and
wherein the source for the first wide band-gap MISFET and the source for the second wide band-gap MISFET are positioned in a common well that is formed in the collector.

22. The high power switching device of claim 21, wherein the BJT is configured to provide a current carrying path for at least a portion of surge currents that flow through the power switching device.

23. The high power switching device of claim 21, wherein the BJT, the first wide band-gap MISFET and the second wide band-gap MISFET comprise silicon carbide based devices.

24. The high power switching device of claim 21, wherein the switching device comprises:
- an n-type silicon carbide drift layer that comprises the collector, the first n-type source/drain region of the power MISFET and the first n-type source/drain region of the driver MISFET;
- a p-type silicon carbide base layer that comprises the base on the n-type silicon carbide drift layer;
- a p-type silicon carbide p-well on the n-type silicon carbide drift layer;
- an n-type silicon carbide emitter region that comprises the emitter on the p-type silicon carbide base layer;
- a first gate electrode on the p-well and separated from the second n-type source/drain region of the driver MISFET and the n-type silicon carbide drift layer by a first gate insulation layer; and
- a second gate electrode on the p-well and separated from the second n-type source/drain region of the power MISFET and the n-type silicon carbide drift layer by a second gate insulation layer;
- wherein the first source/drain region of the driver MISFET comprises an n-type silicon carbide region in an upper portion of the silicon carbide p-well; and
- wherein the first n-type source/drain region of the power MISFET comprises an n-type silicon carbide region in an upper portion of the silicon carbide p-well.

25. The high power switching device of claim 24, wherein the switching device further comprises:
- a heavily-doped p-type silicon carbide region on the p-type silicon carbide base layer adjacent the n-type silicon carbide emitter region; and
- an electrical connection between the heavily-doped p-type silicon carbide region and the first n-type source/drain region of the driver MISFET.

26. The power switching device of claim 21, wherein a first current path length between a source contact of the first wide band-gap MISFET and a drain contact of the first wide band-gap MISFET is substantially the same as a second current path length between a contact for the emitter of the wide band-gap BJT and the contact for the collector of the wide band-gap BJT.

27. A method of operating a semiconductor switching device that includes a wide band-gap power transistor, a wide band-gap surge current transistor coupled in parallel with the wide band-gap power transistor and a wide band-gap driver transistor that is configured to provide a base current to the wide band-gap surge current transistor, the method comprising:
- operating the semiconductor switching device so that a drain-source voltage of the wide band-gap power transistor is within a first voltage range and substantially all of an output current of the semiconductor switching device flows through a channel of the wide band-gap power transistor; and
- operating the semiconductor switching device so that the drain-source voltage of the wide band-gap power transistor is within a second voltage range having voltages that are higher than the voltages in the first voltage range and the output current flows through both the wide band-gap surge current transistor and the channel of the wide band-gap power transistor with more than half of the output current flowing through the wide band-gap surge current transistor.

28. The method of claim 27, wherein a gate of the wide band-gap power transistor, a gate of the wide band-gap driver transistor and a contact for an emitter of the wide band-gap surge current transistor are on a first side of the semiconductor switching device, and wherein a contact for a collector of the wide band-gap surge current transistor is on a second side of the semiconductor switching device that is opposite the first side.

29. The method of claim 28, wherein a first current path length between a source contact of the wide band-gap power transistor and a drain contact of the wide band-gap power transistor is substantially the same as a second current path length between the contact for the emitter of the wide band-gap surge current transistor and the contact for the collector of the wide band-gap surge current transistor.

30. The method of claim 27, further comprising saturating a surge current flowing through the semiconductor switching device.

* * * * *

UNITED STATES PATENT AND TRADEMARK OFFICE
CERTIFICATE OF CORRECTION

PATENT NO.         : 8,193,848 B2                                   Page 1 of 1
APPLICATION NO.    : 12/610582
DATED              : June 5, 2012
INVENTOR(S)        : Zhang et al.

It is certified that error appears in the above-identified patent and that said Letters Patent is hereby corrected as shown below:

On the Title Page
Item (56) References Cited, Other Publications, page 4, Line 11, Chakraborty et al.:
    Please correct "SiO$_2$SiC" to read -- SiO$_2$/SiC --

Column 2, Line 24: Please correct "current transistor, These"
    to read -- current transistor. These --
Column 7, Line 7: Please correct "an NPN BIT, the" to read -- an NPN BJT, the --
Column 8, Line 39: Please correct "and the BIT 130" to read -- and the BJT 130 --
Column 10, Line 37: Please correct "BIT 230. All" to read -- BJT 230. All --
  Line 40: Please correct "if silicone carbide" to read -- n-silicone carbide --
  Line 45: Please correct "the BIT 230 and" to read -- the BJT 230 and --
  Line 57: Please correct "BIT 230. Portions" to read -- BJT 230. Portions --
  Line 60: Please correct "of the BIT 230." to read -- of the BJT 230. --
Column 11, Line 10: Please correct "of BIT 230" to read -- of BJT 230 --
  Line 47: Please correct "of BIT 230 (i.e.," to read -- of BJT 230 (i.e., --
  Line 52: Please correct "with the BIT 230" to read -- with the BJT 230 --
Column 14, Line 19: Please correct "SIC MOSFET." to read -- SiC MOSFET. --
  Line 41: Please correct "and the BIT 630" to read -- and the BJT 630 --
Column 15, Line 7: Please correct "MOS-gated &IT surge"
    to read -- MOS-gated BJT surge --

In the Claims:
Column 16, Claim 6, Line 44: Please correct "connected to a the collector"
    to read -- connected to the collector --

Signed and Sealed this
Twenty-second Day of January, 2013

David J. Kappos
*Director of the United States Patent and Trademark Office*